(12) United States Patent
Lombardi et al.

(10) Patent No.: US 12,321,196 B2
(45) Date of Patent: Jun. 3, 2025

(54) FOLDING PORTABLE DISPLAY DEVICE

(71) Applicant: Google LLC, Mountain View, CA (US)

(72) Inventors: Michael J. Lombardi, Chicago, IL (US); Joe Allore, Chicago, IL (US)

(73) Assignee: Google LLC, Mountain View, CA (US)

( * ) Notice: Subject to any disclaimer, the term of this patent is extended or adjusted under 35 U.S.C. 154(b) by 159 days.

(21) Appl. No.: 17/906,964

(22) PCT Filed: Dec. 22, 2020

(86) PCT No.: PCT/US2020/066676
§ 371 (c)(1),
(2) Date: Sep. 21, 2022

(87) PCT Pub. No.: WO2021/194595
PCT Pub. Date: Sep. 30, 2021

(65) Prior Publication Data
US 2023/0115172 A1  Apr. 13, 2023

Related U.S. Application Data

(60) Provisional application No. 63/001,001, filed on Mar. 27, 2020.

(51) Int. Cl.
*G06F 1/16* (2006.01)
*G09F 9/30* (2006.01)
*H10K 59/00* (2023.01)

(52) U.S. Cl.
CPC .......... *G06F 1/1652* (2013.01); *G06F 1/1616* (2013.01); *G06F 1/1681* (2013.01); *G09F 9/301* (2013.01); *H10K 59/00* (2023.02)

(58) Field of Classification Search
CPC .... G06F 1/1652; G06F 1/1616; G06F 1/1681; G06F 1/1615; G06F 1/1641; G06F 1/16;
(Continued)

(56) References Cited

U.S. PATENT DOCUMENTS 8,599,546 B2 * 12/2013 Nagasaki .............. G06F 1/1681
16/322
8,971,031 B2 * 3/2015 Mok ...................... G06F 1/1656
361/679.27
(Continued)

FOREIGN PATENT DOCUMENTS

CN    108648624 A    10/2018
CN    207977988 U    10/2018
(Continued)

OTHER PUBLICATIONS

International Preliminary Report on Patentability from International Application No. PCT/US2020/066676 dated Oct. 6, 2022, 15 pp.
(Continued)

*Primary Examiner* — Allen L Parker
*Assistant Examiner* — Martin Antonio Asmat Uceda
(74) *Attorney, Agent, or Firm* — Shumaker & Sieffert, P.A.

(57) ABSTRACT

An example a folding device includes a first assembly having an inner and an outer surface; a second assembly having an inner and an outer surface; and a continuous display including: a first rigid segment attached to and coplanar with the inner surface of the first assembly, a second rigid segment attached to and coplanar with the inner surface of the second assembly, a primary flexible segment; and a third rigid segment disposed between the second rigid segment and the primary flexible segment, wherein the third rigid segment is articulable relative to the second rigid segment.

22 Claims, 21 Drawing Sheets

(58) Field of Classification Search
CPC ....... G09F 9/301; G09F 1/1681; H10K 59/00; F16C 11/04; H04M 1/022; H04M 1/0214; H04M 1/0216; H04M 1/0268
See application file for complete search history.

(56) References Cited

U.S. PATENT DOCUMENTS

| | | | | |
|---|---|---|---|---|
| 9,235,239 | B2* | 1/2016 | van Dijk | H04M 1/0268 |
| 9,348,450 | B1* | 5/2016 | Kim | H04M 1/0268 |
| 9,470,404 | B2* | 10/2016 | Lee | G09F 9/301 |
| 9,535,452 | B2* | 1/2017 | Ahn | G06F 1/1615 |
| 9,600,035 | B2* | 3/2017 | Park | G06F 1/1681 |
| 9,798,359 | B2* | 10/2017 | Seo | G06F 1/1652 |
| 9,844,251 | B2* | 12/2017 | Lin | G06F 1/1652 |
| 9,857,849 | B1* | 1/2018 | Siddiqui | G06F 1/1618 |
| 10,342,121 | B2* | 7/2019 | Koo | H05K 5/0017 |
| 10,474,196 | B2* | 11/2019 | Yeh | G06F 1/1681 |
| 10,551,880 | B1* | 2/2020 | Ai | G06F 1/1641 |
| 10,659,584 | B2* | 5/2020 | Mok | G06F 1/1656 |
| 10,831,243 | B2* | 11/2020 | Kim | G06F 1/1652 |
| 10,912,214 | B2* | 2/2021 | Kang | H05K 5/0217 |
| 11,016,530 | B2* | 5/2021 | Watamura | G06F 1/1652 |
| 11,223,710 | B2* | 1/2022 | Cheng | H04M 1/0268 |
| 11,231,754 | B2* | 1/2022 | Kang | H04M 1/022 |
| 11,474,570 | B2* | 10/2022 | Lee | G06F 1/1652 |
| 11,550,368 | B2* | 1/2023 | Huang | H04M 1/022 |
| 11,622,457 | B2* | 4/2023 | Hsu | G06F 1/1615 |
| | | | | 361/809 |
| 2007/0117600 | A1* | 5/2007 | Robertson | G06F 1/1681 |
| | | | | 455/575.1 |
| 2012/0044620 | A1* | 2/2012 | Song | H04M 1/0216 |
| | | | | 361/679.01 |
| 2015/0233162 | A1 | 8/2015 | Lee et al. | |
| 2015/0241925 | A1 | 8/2015 | Seo et al. | |
| 2015/0330614 | A1 | 11/2015 | Lee et al. | |
| 2018/0196468 | A1 | 7/2018 | Watamura et al. | |
| 2019/0036068 | A1 | 1/2019 | Kim et al. | |
| 2019/0132947 | A1 | 5/2019 | Koo et al. | |

FOREIGN PATENT DOCUMENTS

| | | |
|---|---|---|
| JP | 2018116467 A | 1/2018 |
| JP | 2018112835 A | 7/2018 |
| JP | 2019028467 A | 2/2019 |
| KR | 20150130652 A | 11/2015 |
| KR | 20190143161 A | 12/2019 |
| WO | 2015190733 A1 | 12/2015 |
| WO | 2019134696 A1 | 7/2019 |

OTHER PUBLICATIONS

Office Action, and translation thereof, from counterpart Japanese Application No. 2022-558227 dated Nov. 1, 2023, 12 pp.
International Search Report & Written Opinion from International Application No. PCT/US2020/066676, dated Jul. 12, 2021, 23 pp.
Response to Communication Pursuant to Rules 161(1) and 162 EPC dated Sep. 30, 2022, from counterpart European Application No. 20842876.3, filed Mar. 16, 2023, 17 pp.
Office Action, and translation thereof, from counterpart Japanese Application No. 2022-558227 dated Apr. 16, 2024, 10 pp.
Decision to Grant a Patent from counterpart Japanese Application No. 2022-558227 dated Aug. 28, 2024, 6 pp.
Response to Office Action dated Apr. 16, 2024, from counterpart Japanese Application No. 2022-558227 filed Jul. 3, 2024, 14 pp.
Office Action, and translation thereof, from counterpart Korean Application No. 10-2022-7033443 dated Jul. 10, 2024, 13 pp.
Notice of Intent to Grant, and translation thereof, from counterpart Japanese Application No. 2022-558227 dated Sep. 3, 2024, 6 pp.
Notice of Intent to Grant, and translation thereof, from counterpart Korean Application No. 10-2022-7033443 dated Oct. 10, 2024, 8 pp.
Communication pursuant to Article 94(3) EPC from counterpart European Application No. 20842876.3 dated Apr. 17, 2025, 7 pp.

* cited by examiner

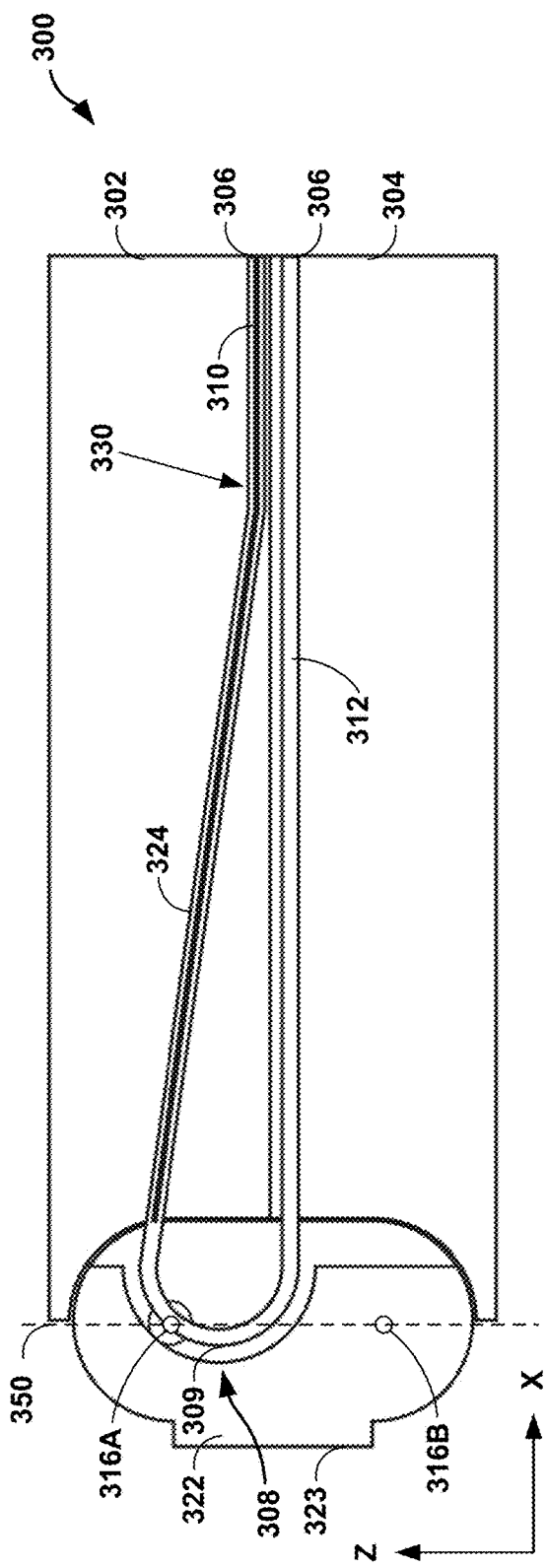
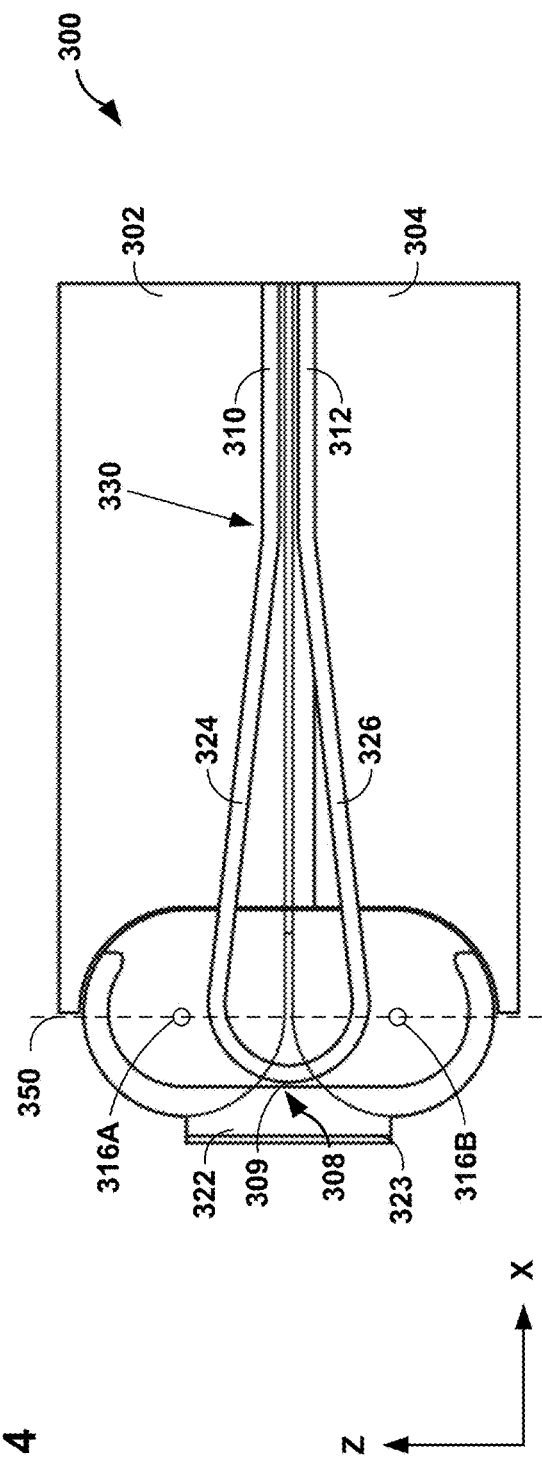
FIG. 4
FIG. 5

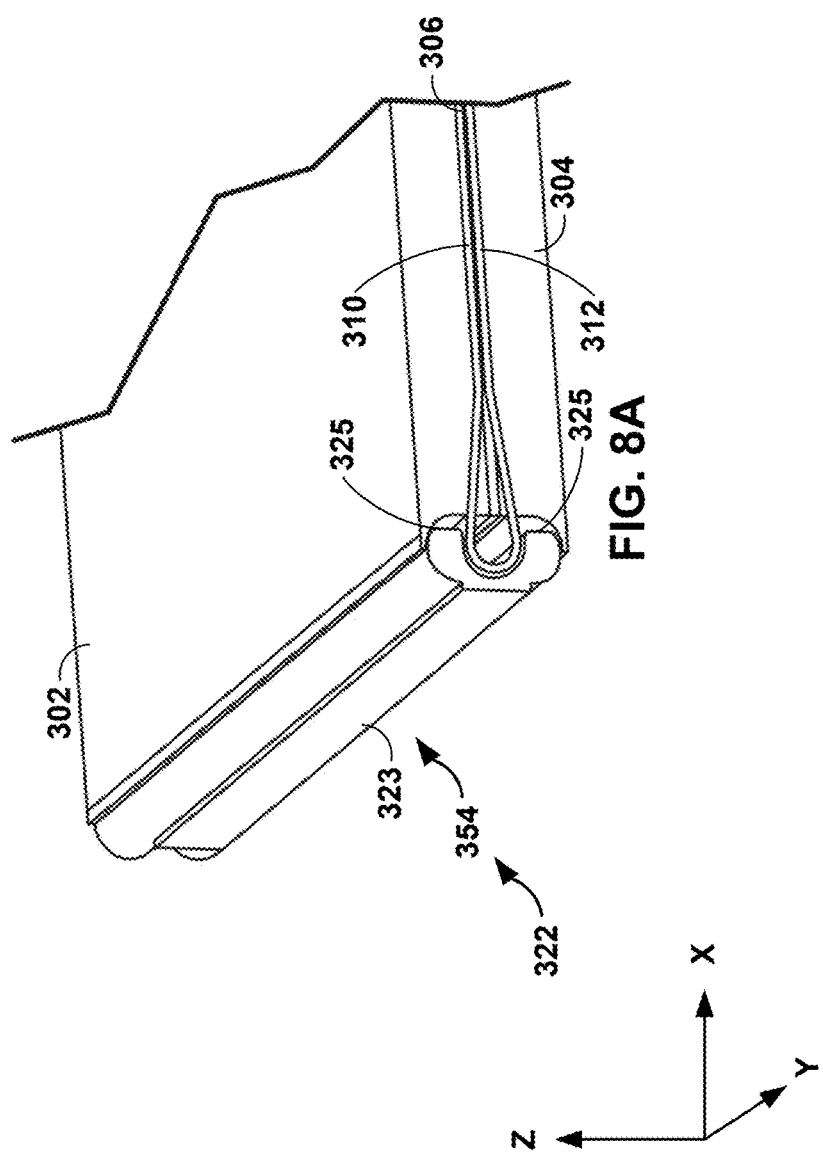
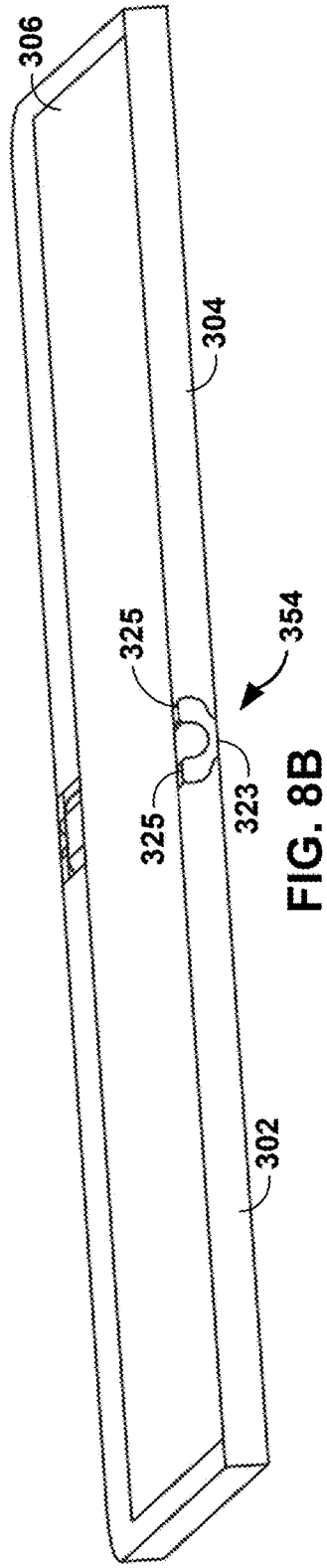

60°

30°

120°

90°

150°

140°

170°

160°

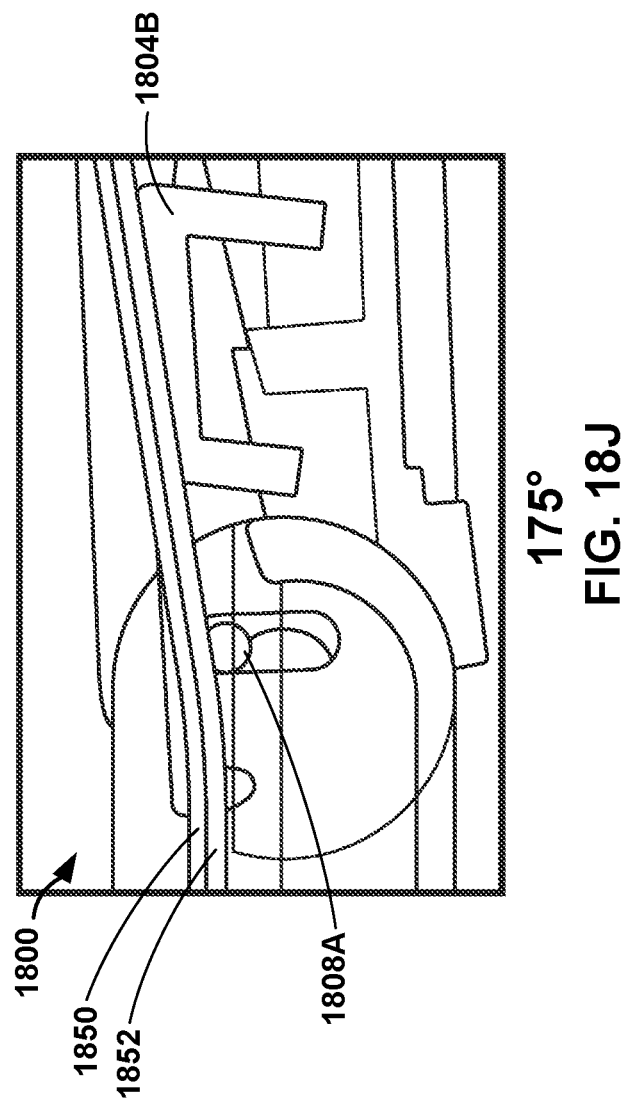

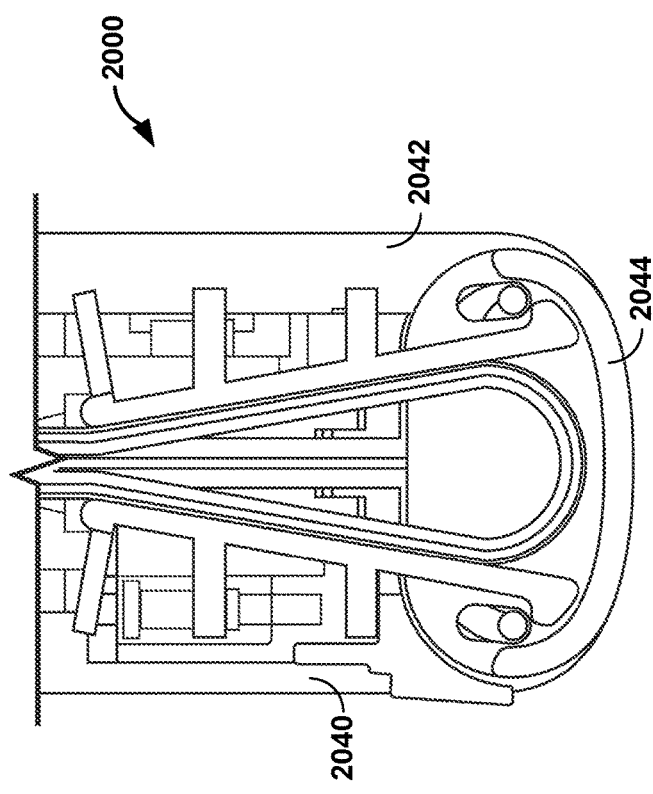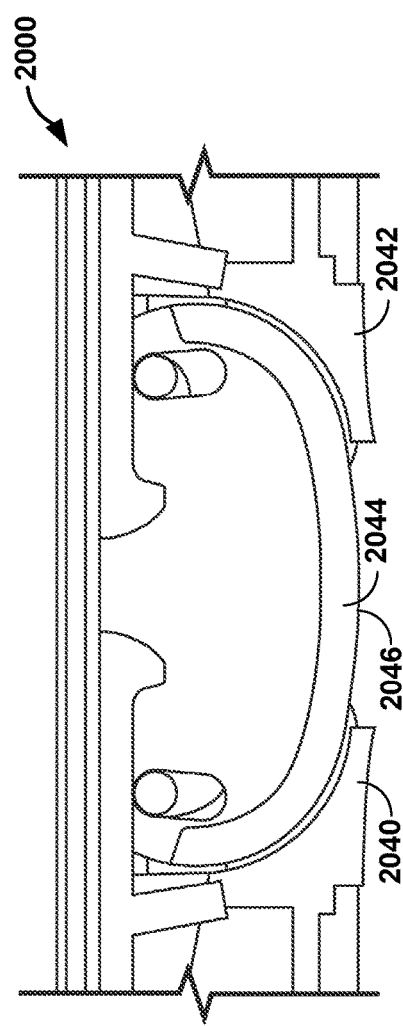
FIG. 20A
FIG. 20B

FOLDING PORTABLE DISPLAY DEVICE

This application is a National Stage Entry of International Application No. PCT/US2020/066676, filed Dec. 22, 2020, which claims the benefit of U.S. Provisional Application Ser. No. 63/001,001, filed Mar. 27, 2020, each of which are hereby incorporated by reference.

BACKGROUND

Devices that include displays may be referred to as display devices. In general, it may be desirable to increase a size of a display (e.g., the area on which images are displayed) as much as possible. However, increasing the size of a display may make the device that includes the display large and unwieldy. For instance, devices with larger displays may not fit in pockets, bags, and the like. One way to increase the size of a display without unduly increasing the size of the device is to make the device collapsible such that the display can be folded (e.g., in half).

SUMMARY

In general, aspects of this disclosure are directed to folding devices that include foldable continuous displays. A folding device may include at least two assemblies (e.g., panels) and a mechanism configured to allow the assemblies to be moved into a collapsed state in which the device is considered closed and an expanded state in which the device is considered open. When the device is in the expanded state, a display may be visible and may cover at least a portion of an inner surface of all of the assemblies. As such, the device may be considered to be a continuous display (i.e., because it continues across a boundary between the assemblies). By utilizing such a folding device, the device may include a display with a relatively large length and/or width (e.g., display area) without overly increasing a length and/or width of the device when in the collapsed state. In this way, the "pocketability" of large-screen portable devices may be improved.

However, in some examples, some designs for mechanisms that enable assemblies to be moved may introduce one or more disadvantages. As one example, while the length and/or width of the device may be reduced (e.g., relative to a non-folding device with equivalent screen size), incorporate of the mechanism may increase a thickness of the device. As another example, some designs for mechanisms may result in a relatively small bend radius of the display, which may result in a crease of the display. As another example, some designs may result in a large portion of the display being unsupported when the device is in the expanded state. As another example, the mechanism may be complex and expensive to manufacture.

In accordance with one or more aspects of this disclosure, as opposed to including two rigid segments connected by a single flexible segment, a continuous display of a folding device may include at least three rigid segments and a primary flexible segment. For instance, a continuous display may include a first rigid segment that spans a majority of a width of a first assembly, a second rigid segment that spans a majority of a width of a second assembly, a third rigid segment that spans a minority of a width of the second assembly and is articulable relative to the second rigid segment (e.g., the third rigid segment is hinged relative to the second rigid segment), and a primary flexible segment that connects display segments of the first assembly with display segments of the second assembly. By including multiple rigid segments for at least the second assembly, the primary flexible segment may retain a large bend radius without having a large unsupported span.

In one example, a folding device includes a first assembly having an inner and an outer surface; a second assembly having an inner and an outer surface; and a continuous display including: a first rigid segment attached to and coplanar with the inner surface of the first assembly, a second rigid segment attached to and coplanar with the inner surface of the second assembly, a primary flexible segment; and a third rigid segment disposed between the second rigid segment and the primary flexible segment, wherein the third rigid segment is articulable relative to the second rigid segment.

The details of one or more examples are set forth in the accompanying drawings and the description below. Other features, objects, and advantages of the disclosure will be apparent from the description and drawings, and from the claims.

BRIEF DESCRIPTION OF DRAWINGS

FIG. 4 is a schematic diagram illustrating a cross section of a folding device with a multi-rigid segment flexible display, in accordance with one or more aspects of this disclosure.

FIG. 5 is a schematic diagram illustrating a cross section of a folding device with a multi-rigid segment flexible display, in accordance with one or more aspects of this disclosure.

FIGS. 8A and 8B are schematic diagrams illustrating cross sections of a folding device with a multi-rigid segment flexible display, in accordance with one or more aspects of this disclosure.

FIGS. 18A-18K are schematic diagrams illustrating cross sections of a folding device with a flexible display having support platforms in a variety of positions, in accordance with one or more aspects of this disclosure.

FIGS. 20A and 20B are schematic diagrams illustrating cross sections of a folding device with a flexible display in open and closed positions, in accordance with one or more aspects of this disclosure.

DETAILED DESCRIPTION

Figure 1:
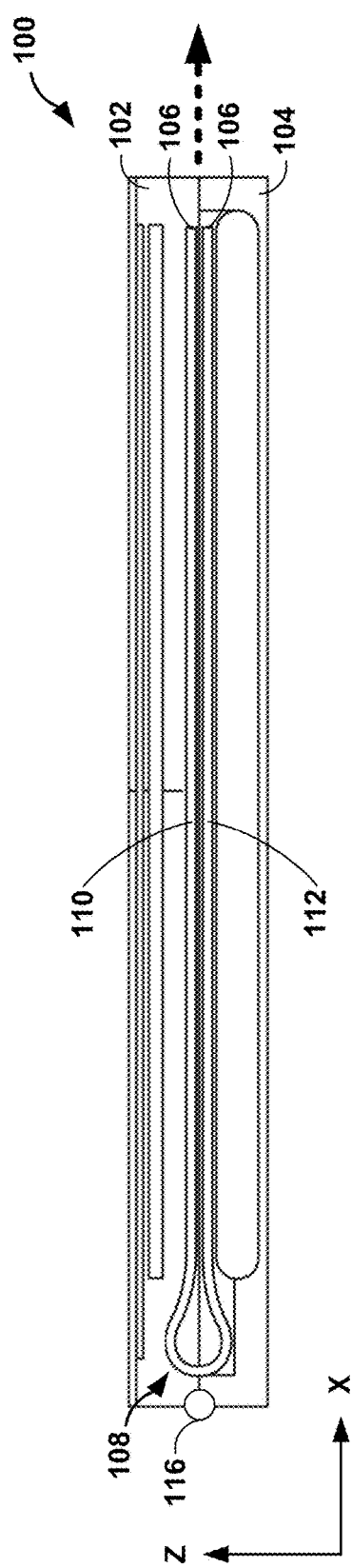
FIG. 1 is a schematic diagram illustrating a cross section of a folding device with a teardrop shape flexible display, in accordance with one or more aspects of this disclosure.

FIG. 1 is a schematic diagram illustrating a cross section of a folding device with a teardrop shape flexible display, in accordance with one or more aspects of this disclosure. Examples of device 100 include foldable mobile computing devices such as foldable smart phones, foldable tablets, foldable e-readers, foldable gaming systems, or any other foldable portable device that includes a display.

As shown in FIG. 1, device 100 includes first assembly 102, second assembly 104, and continuous display 106. First assembly 102 and second assembly 104 may be configured to rotate about hinge point 116.

Continuous display 106 includes first rigid segment 110 attached to first assembly 102, flexible segment 108, and second rigid segment 112 attached to second assembly 104. As can be seen in the example of FIG. 1, flexible segment 108 forms a teardrop shape when device 100 is closed.

The teardrop shape of flexible segment 108 may provide a large bend radius, which means less crease. However, when device 100 is open, a long span of continuous display 106 may be unsupported, which may result in waviness.

The design of device 100 may theoretically maximize available internal volume (e.g., of first assembly 102 and second assembly 104). Such volume maximization may enable additional components to be added and/or larger components to be used (e.g., may allow for a bigger battery). However, the design of continuous display 106 may require the use of a rotate and slide mechanism, which may utilize some of the provided volume. In particular, when device 100 is opened, the expanding of flexible segment 108 may require that one or both of first rigid segment 110 and/or second rigid segment 112 slide in the direction indicated by the arrow (e.g., in order for continuous display 106 to be flat).

Figure 2:
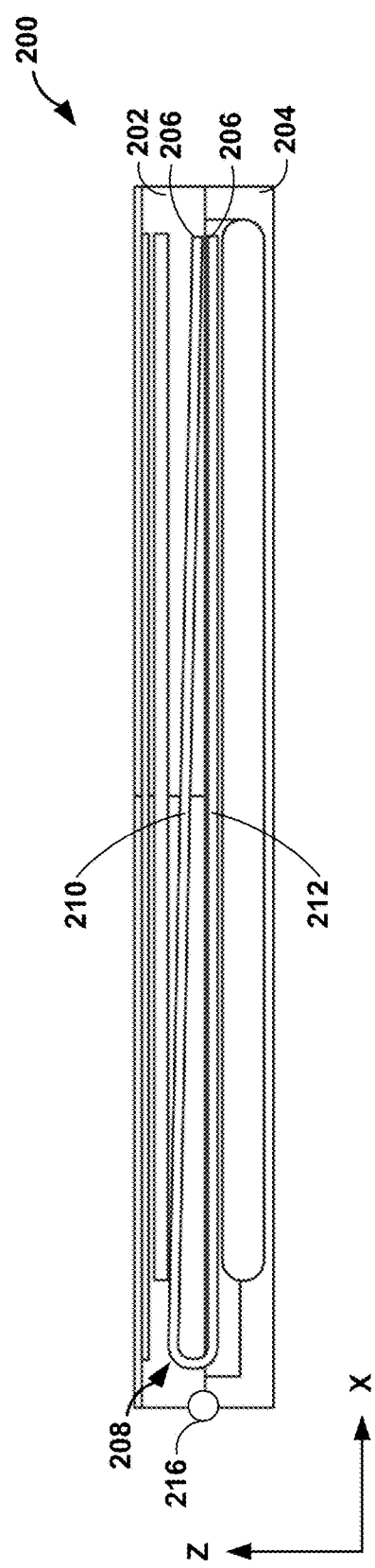
FIG. 2 is a schematic diagram illustrating a cross section of a folding device with a U-shape flexible display, in accordance with one or more aspects of this disclosure.

FIG. 2 is a schematic diagram illustrating a cross section of a folding device with a U-shape flexible display, in accordance with one or more aspects of this disclosure. Examples of device 200 include foldable mobile computing devices such as foldable smart phones, foldable tablets, foldable e-readers, foldable gaming systems, or any other foldable portable device that includes a display.

As shown in FIG. 2, device 200 includes first assembly 202, second assembly 204, and continuous display 206. First assembly 202 and second assembly 204 may be configured to rotate about hinge point 216.

Continuous display 206 includes first rigid segment 210 attached to first assembly 202, flexible segment 208, and second rigid segment 212 attached to second assembly 204. As can be seen in the example of FIG. 2, flexible segment 208 forms a U-shape when device 200 is closed.

The U-shape of flexible segment 208 may provide a tighter bend radius (e.g., as compared to the teardrop shape of flexible segment 108 of FIG. 1), which may result in a visible crease. However, when device 100 is open, the span of continuous display 206 that is unsupported may be relatively short (e.g., as compared to the unsupported span of continuous display 106), which may result in minimal to no waviness.

The design of device 200 may consume more internal volume (e.g., of second assembly 204) to house continuous display 206 than the design of device 100. However, in contrast to device 100, no rotate and slide mechanism may be needed for device 200.

The designs of device 100 and device 200 (i.e., teardrop and U-shaped flexible displays) may present one or more disadvantages. As one example, it may not be possible to reduce the thickness (e.g., in the z-axis) of devices that employ the designs of device 100 and device 200. For example, it may be desirable for a foldable device to have a thickness of less than 10 mm.

In accordance with one or more aspects of this disclosure, as opposed to including two rigid segments connected by a single flexible segment, a continuous display of a folding device may include at least three rigid segments and a primary flexible segment. For instance, a continuous display may include a first rigid segment that spans a majority of a width of a first assembly, a second rigid segment that spans a majority of a width of a second assembly, a third rigid segment that spans a minority of a width of the second assembly and is articulable relative to the second rigid segment (e.g., the third rigid segment is hinged relative to the second rigid segment), and a primary flexible segment that connects display segments of the first assembly with display segments of the second assembly. By including multiple rigid segments for at least the second assembly, the primary flexible segment may retain a large bend radius without having a large unsupported span.

Figure 3:
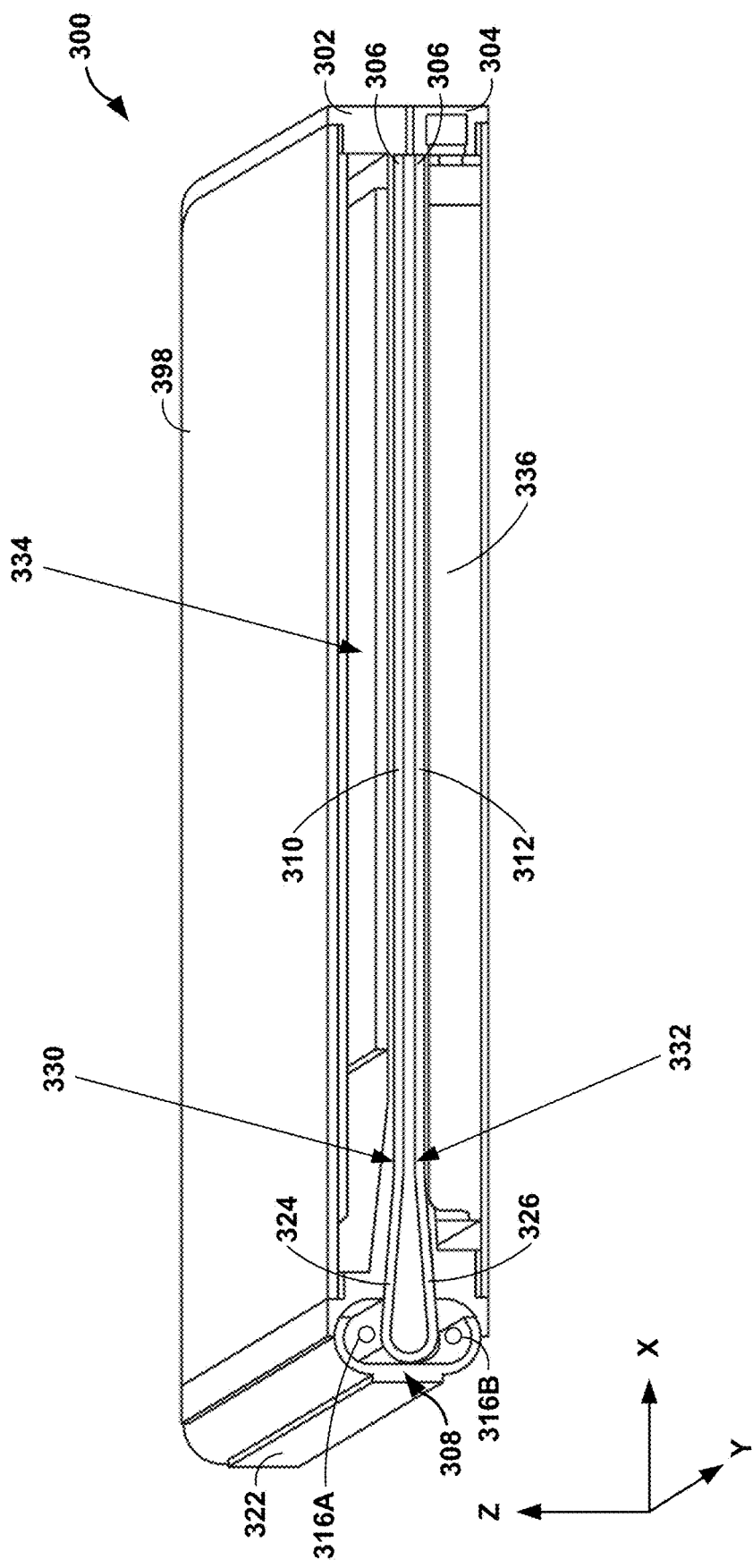
FIG. 3 is a schematic diagram illustrating a cross section of a folding device with a multi-rigid segment flexible display, in accordance with one or more aspects of this disclosure.

FIG. 3 is a schematic diagram illustrating a cross section of a folding device with a multi-rigid segment flexible display, in accordance with one or more aspects of this disclosure. Examples of device 300 include foldable mobile computing devices such as foldable smart phones, foldable tablets, foldable e-readers, foldable gaming systems, or any other foldable portable device that includes a foldable display.

As shown in FIG. 3, device 300 includes first assembly 302, second assembly 304, continuous display 306, and hinge assembly 322. First assembly 302 may be configured to rotate about first axis 316A, which defines a first axis in the y-direction, and second assembly 304 may be configured to rotate about second axis 316B, which defines a second axis in the y-direction. Each of first assembly 302 and second assembly 304 may include an inner surface and an outer surface. The outer surface of first assembly 302 may be visible when looking down at device 300 in the z-axis and the outer surface of second assembly 304 may be visible when looking up at device 300 in the z-axis. The inner surfaces of first assembly 302 and second assembly 304 may not be externally visible when device 300 is closed.

As shown in FIG. 3, first assembly 302 may include main logic board 334 and second assembly 304 may include battery 336. This is merely one example arrangement of components amongst first assembly 302/second assembly 304 and other arrangements are possible. For instance, both first assembly 302 and second assembly 304 may include respective batteries.

Continuous display 306 may be capable of rendering data into images viewable by a user of device 300. For example, continuous display 306 may include a matrix of pixels that are individually controllable. Examples of continuous display 306 include, but are not limited to, liquid crystal displays (LCD), light emitting diode (LED) displays, organic light-emitting diode (OLED) displays, micro light-emitting diode (microLED) displays, or similar monochrome or color displays capable of outputting visible information to a user of device 300.

In some examples, device 300 may include one or more displays in addition to continuous display 306. For instance, as shown in FIG. 3, device 300 may include a first additional display on the outer surface of first assembly 302 (e.g., display 398). In some examples, device 300 may further include a second additional display on the outer surface of second assembly 304.

One or more of continuous display 306, the first additional display, and/or the second additional display may be presence-sensitive displays. In some examples, a presence sensitive display may detect an object at and/or near a screen. As one example range, a presence-sensitive display may detect an object, such as a finger or stylus that is within 2 inches or less of the screen. The presence-sensitive display may determine a location (e.g., an (x,y) coordinate) of a screen at which the object was detected. In another example range, a presence-sensitive display may detect an object six inches or less from the screen and other ranges are also possible. The presence-sensitive display may determine the location of the screen selected by a user's finger using capacitive, inductive, and/or optical recognition techniques. In some examples, presence sensitive display also provides output to a user using tactile, audio, or video stimuli.

Continuous display 306 includes first rigid segment 310 attached to first assembly 302 (e.g., positioned on the inner surface of first assembly 302 and coplanar with the inner surface of first assembly 302), flexible segment 308, and second rigid segment 312 attached to second assembly 304 (e.g., positioned on the inner surface of second assembly 304 and coplanar with the inner surface of first assembly 302). As can be seen in the example of FIG. 3, flexible segment 308 further includes rigid segment 324 connecting rigid segment 310 to flexible segment 308 and rigid segment 326 connecting rigid segment 312 to flexible segment 308. When device 300 is fully open, rigid segment 324 may be coplanar with the inner surface of first assembly 302 and rigid segment 326 may be coplanar with the inner surface of second assembly 304. However, when device 300 is fully closed, rigid segment 324 may not be coplanar with the inner surface of first assembly 302 and rigid segment 326 may not be coplanar with the inner surface of second assembly 304. Rigid segment 324 may be articulable relative to rigid segment 310 at hinge point 330. Rigid segment 326 may be articulable relative to rigid segment 312 at hinge point 332.

Rigid segments 310 and 312 may be referred to as primary rigid segments while rigid segments 324 and 326 may be referred to as secondary rigid segments. In some examples, a width (e.g., in the x-direction) of the primary rigid segments may be substantially larger than a width of the secondary rigid segments. For instance, a width of rigid segment 324 may be less than or equal to a quarter (25%) of a width of rigid segment 310. Similarly, a width of rigid segment 326 may be less than or equal to a quarter (25%) of a width of rigid segment 312.

The secondary rigid segments may be articulable relative to neighboring primary rigid segments. As one example, rigid segment 324 may be articulable relative to rigid segment 310 at hinge point 330. As another example, rigid segment 326 may be articulable relative to rigid segment 312 at hinge point 332. In some examples, the articulation points between secondary rigid segments and primary rigid segments (e.g., hinge points 330 and 332) may have large radii and limited movement as compared to the radius and movement of primary flexible segment 308. As one example, rigid segment 324 may be configured to articular at most 45 degrees relative to rigid segment 310. As another example, rigid segment 326 may be configured to articular at most 45 degrees relative to rigid segment 312.

Primary flexible segment 308 may connect the rigid segments of one side of device 300 to the rigid segments of the other side of device 300. For instance, as shown in FIG. 3, primary flexible segment 308 may connect rigid segment 324 to rigid segment 326. Primary flexible segment 308 may be configured to fold at least 180 degrees (e.g., to facilitate closure of device 300).

In some examples, device 300 may include one or more supporting plates (e.g., backer plates) configured to render segments of continuous display 306 flexible or rigid. The supporting plates may be positioned between emissive elements of continuous display 306 (e.g., OLEDs) and the inner surfaces of first assembly 302 and second assembly 304.

In some examples, device 300 may include respective supporting plates for segments of continuous display 306. For instance, the one or more supporting plates may include a first supporting plate attached to first rigid segment 310, a second supporting plate attached to second rigid segment 312, a third supporting plate attached to rigid segment 324, and/or a fourth supporting plate attached to rigid segment 326.

In some examples, the one or more supporting plates may include a respective supporting plate for each of first assembly 302 and second assembly 304 that support segments of continuous display 306 on the respective assembly. For instance, the one or more supporting plates may include a first supporting plate attached to first rigid segment 310 and rigid segment 324 that is configured to permit bending between first rigid segment 310 and rigid segment 324, and a second supporting plate attached to second rigid segment 312 and rigid segment 326 that is configured to permit bending between second rigid segment 312 and rigid segment 326.

In some examples, the one or more supporting plates may include a single supporting plate that is attached to segments of continuous display 306 on both first assembly 302 and second assembly 304. For instance, the one or more supporting plates may include a single supporting plate attached to primary flexible segment 308 and all primary and secondary rigid segments (e.g., first rigid segment 310, second rigid segment 312, rigid segment 324 and rigid segment 326). The single supporting plate may be configured to permit bending between the segments. To permit bending between segments, a supporting plate may be etched and/or perforated at a boundary between adjacent segments.

As discussed above, display 306 may include at least two primary rigid segments and at least one secondary rigid segment. FIG. 4 is a schematic diagram illustrating a cross section of a folding device with a multi-rigid segment flexible display that includes a single secondary rigid segment, in accordance with one or more aspects of this disclosure. As shown in FIG. 4, display 306 may include primary rigid segments 310 and 312, primary flexible segment 308, and secondary rigid segment 324. FIG. 5 is a schematic diagram illustrating a cross section of a folding device with a multi-rigid segment flexible display that includes multiple secondary rigid segments, in accordance with one or more aspects of this disclosure. As shown in FIG. 5, display 306 may include primary rigid segments 310 and 312, primary flexible segment 308, and secondary rigid segments 324 and 326.

In some examples, hinge assembly 322 may include a cavity into which at least a portion of display 306 may recede when device 300 is fully closed. For instance, as discussed in further detail below, a center region of hinge assembly 322 may be "hollowed out" to receive at least a portion of primary flexible segment 308. As shown in FIGS. 4 and 5, when the folding device 300 is fully closed, an apex of the primary flexible segment (e.g., apex 309 of primary flexible segment 308) is closer to the outer surface of the hinge assembly (e.g., outer surface 323 of hinge assembly 322) than a plane that is parallel to the first axis and a second axis (e.g., plane 350 that is parallel to first axis 316A and second axis 316B). By allowing at least a portion of display 306 may recede when device 300 is fully closed, device 300 may avoid the need for a rotate and slide mechanism (e.g., as used for device 100 of FIG. 1). In this way, the design of a foldable display device may be simplified.

Figure 6:
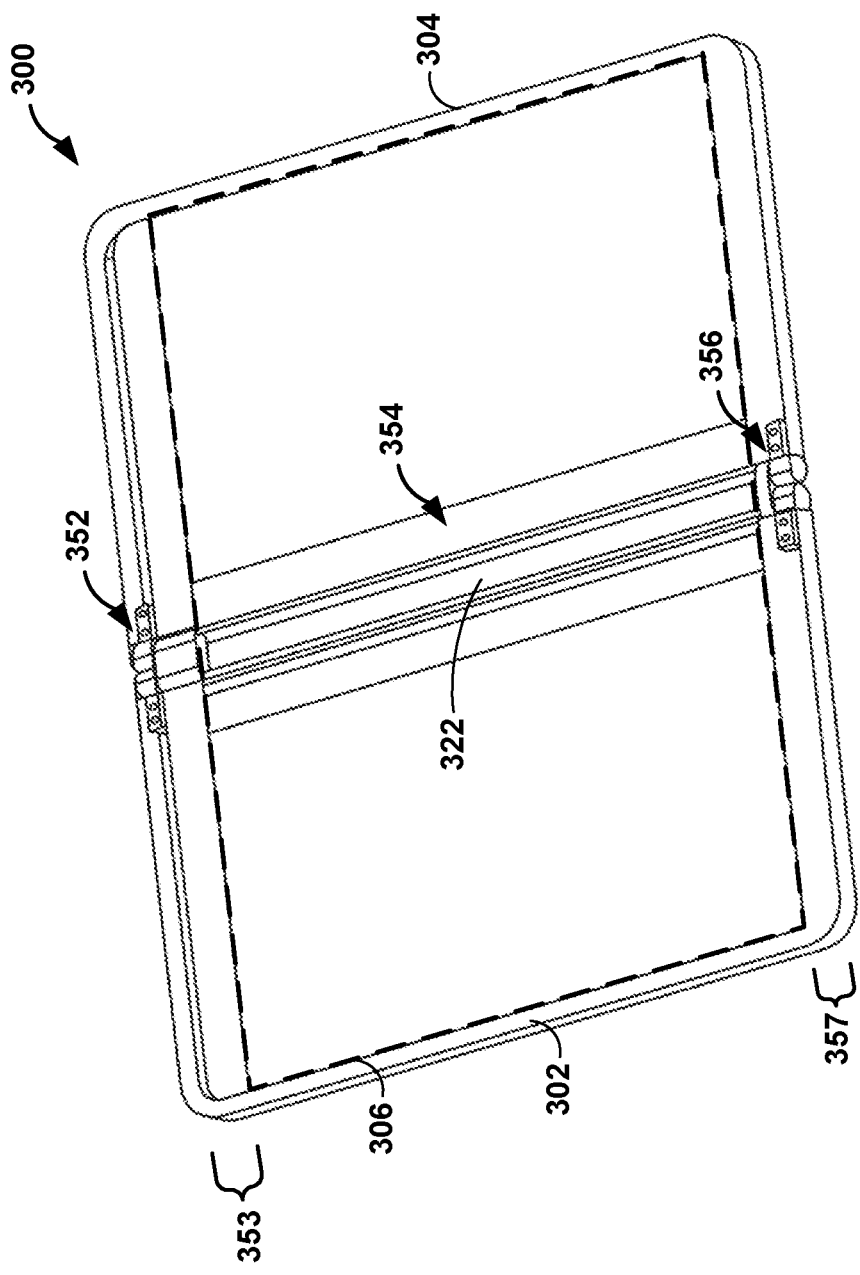
FIG. 6 is a schematic diagram illustrating a folding device with a flexible display, in accordance with one or more aspects of this disclosure.

FIG. 6 is a schematic diagram illustrating a folding device with a flexible display, in accordance with one or more aspects of this disclosure. As shown in FIG. 6 hinge assembly 322 may include top hinge region 352, center hinge region 354, and bottom hinge region 356 (it is noted that the terms top and bottom are used for reference purposes only and regions 352 and 356 may represent any opposing regions of hinge assembly 322, such as a left region and a right region). Display 306 is illustrated as being a transparent perimeter.

As discussed above, hinge assembly 322 may include a cavity into which at least a portion of display 306 may recede when device 300 is fully closed. For instance, center hinge region 354 may include such a cavity. By including such a cavity into hinge assembly 322, mechanical components that connect to first assembly 302 and second assembly 304 may be moved.

In accordance with one or more aspects of this disclosure, device 300 may be extended in a direction parallel to the hinge folding axis (e.g., device 300 may be stretched in the y-axis). In such a design, mechanical components that connect hinge assembly 322 to first assembly 302 and second assembly 304 may be moved into one or both of top hinge region 352 and/or bottom hinge region 356. As such, first assembly 302 and second assembly 304 may each be rotatably connected to top hinge region 352 and bottom hinge region 356. Due to this arrangement, in some examples, the mechanical components that connect hinge assembly 322 to first assembly 302 and second assembly 304 may not be located under (e.g., in the z-axis) display 306. For instance, the mechanical components that connect hinge assembly 322 to first assembly 302 and second assembly 304 may be located under top bezel 353 and/or under bottom bezel 357. As shown in FIG. 6, top bezel 353 and bottom bezel 357 may border display 306.

Figure 7A:
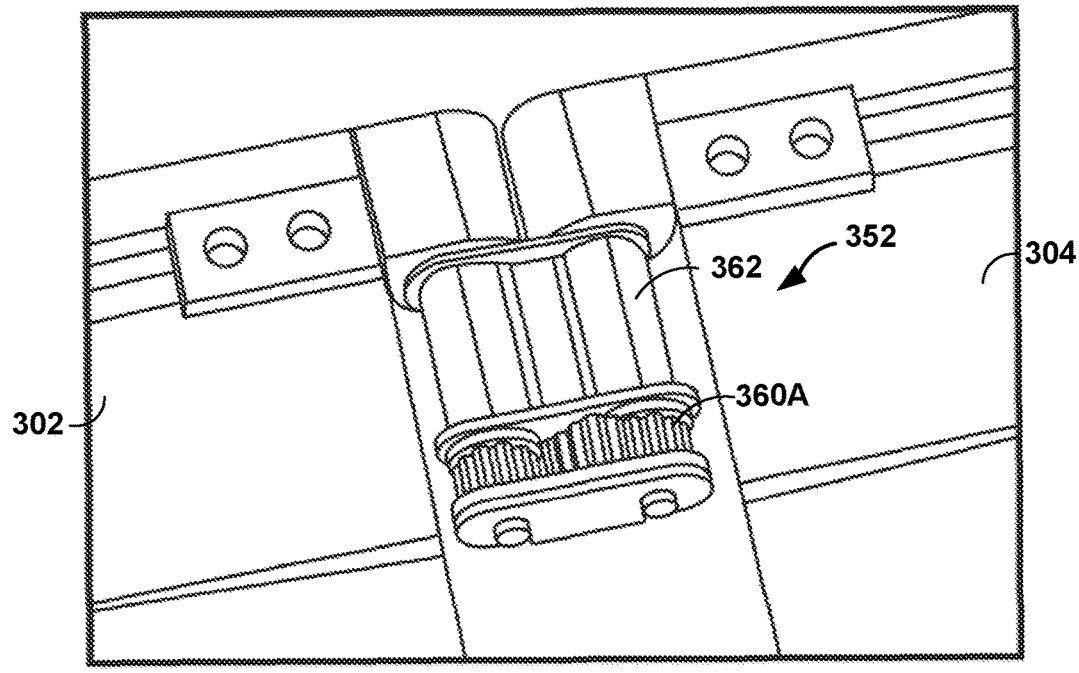
FIGS. 7A and 7B are schematic diagrams illustrating hinges of a folding device with a flexible display, in accordance with one or more aspects of this disclosure.
Figure 7B:
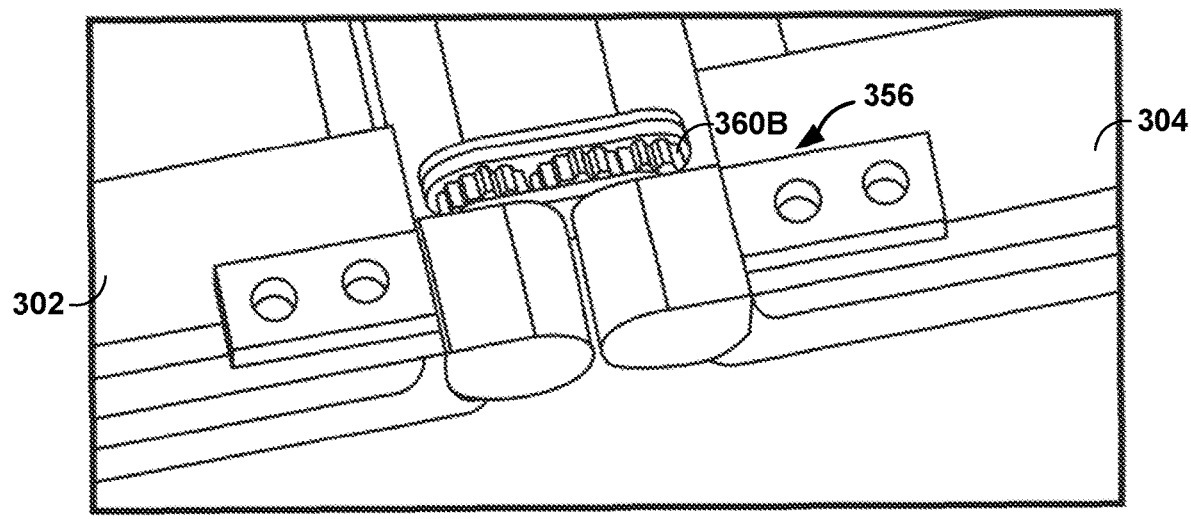

FIGS. 7A and 7B are schematic diagrams illustrating hinges of a folding device with a flexible display, in accordance with one or more aspects of this disclosure. FIG. 7A illustrates further details of one example of top hinge region 352. FIG. 7B illustrates further details of one example of bottom hinge region 356.

In some examples, it may be desirable for first assembly 302 and second assembly 304 to maintain a similar, or identical, rotational angle with respect to hinge assembly 322. In accordance with one or more aspects of this disclosure, one or both of top hinge region 352 and/or bottom hinge region 356 may include synchronization components configured to match rotation of first assembly 302 about first axis 316A with rotation of second assembly 304 about second axis 316B. As one example, top hinge region 352 may include synchronization components 360A. As another example, bottom hinge region 356 may include synchronization components 360B. Synchronization components 360A and 360B (collectively "synchronization components 360") may be any mechanical components that synchronize the rotations of first assembly 302 and second assembly 304 (e.g., components that cause device 300 to open symmetrically). For instance, synchronization components 360 may each include a first gear connected to the first assembly and rotating about the first axis, a second gear connected to the second assembly and rotating about the second axis, two or more intermediate gears connecting the first gear to the second gear.

In some examples, it may be desirable for first assembly 302 and second assembly 304 to stay at a position. For instance, it may be desirable to increase the amount of force required to rotate first assembly 302 and second assembly 304 (e.g., the amount of force to open/close device 300). In accordance with one or more aspects of this disclosure, hinge assembly 322 may include one or more resistive components configured to increase the amount of force required to rotate first assembly 302 and second assembly 304. For instance, top hinge region 352 may include friction sleeve 362 that increases the amount of force needed to rotate first assembly 302 about first axis 316A and/or increases the amount of force needed to rotate second assembly 304 about second axis 316B.

Synchronization components 360 may, in some examples, be considered to be included in the mechanical components that connect hinge assembly 322 to first assembly 302 and second assembly 304. As discussed above, said mechanical components may not be located under display 306.

FIGS. 8A and 8B are schematic diagrams illustrating cross sections of a folding device with a multi-rigid segment flexible display, in accordance with one or more aspects of this disclosure. As shown in FIG. 8A, center hinge region 354 includes clearance (e.g., a cutout, cavity, etc.) to receive at least a portion of display 306 when device 300 is closed. As shown in FIGS. 8A and 8B, center hinge region 354 includes outer surface 323 and inner surface 325. As shown in FIG. 8B, inner surface 325 may support a portion of display 306 (e.g., a rear surface of primary flexible segment 308) when device 300 is open. By using inner surface 325 to provide support to display 306 when device 300 is open, waviness in display 306 may be minimized or eliminated.

As shown in the example of FIG. 8A (and others), first rigid segment 310 may be parallel to second rigid segment when device 300 is fully closed. Additionally or alternatively, the outer surface of first assembly 302 may be parallel to the outer surface of second assembly 304 when device 300 is fully closed. Such parallelization may be possible due to various design features of device 300. As one example, the aforementioned parallelization may be facilitated by allowing an apex of the primary flexible segment of display 306 to be closer to outer surface 323 of hinge assembly than 322 a plane that is parallel to first axis 316A and second axis 316B (e.g., plane 350) when device 300 is fully closed.

Figure 9:
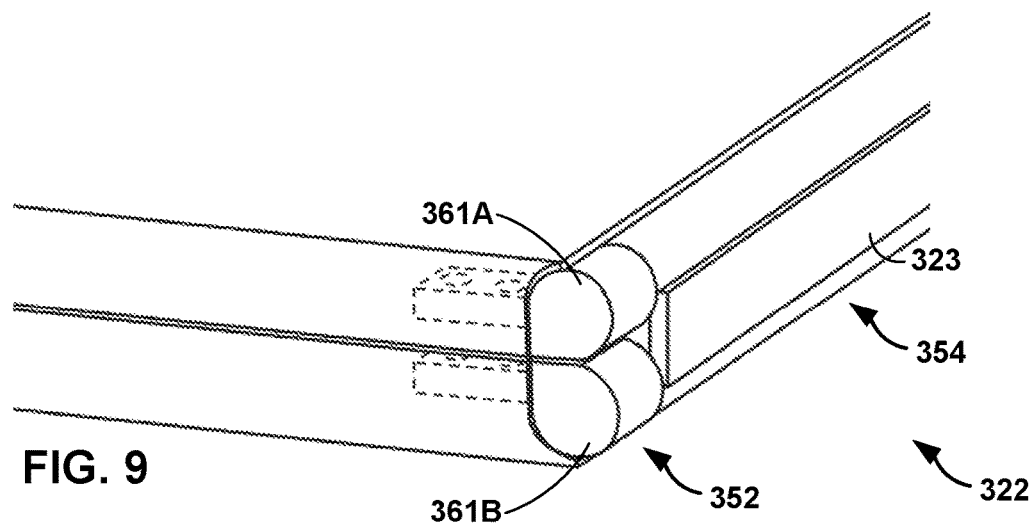
FIG. 9 is a schematic diagram illustrating a hinge of a folding device with a flexible display, in accordance with one or more aspects of this disclosure.

FIG. 9 is a schematic diagram illustrating a hinge of a folding device with a flexible display, in accordance with one or more aspects of this disclosure. As shown in FIG. 9, top hinge region 352 may include rotating hinge member 361A that attaches to first assembly 302 and rotates about first axis 316A and rotating hinge member 361B that attaches to second assembly 304 and rotates about second axis 316B. Bottom hinge region 356 may include similar rotating hinge members.

Figure 10:
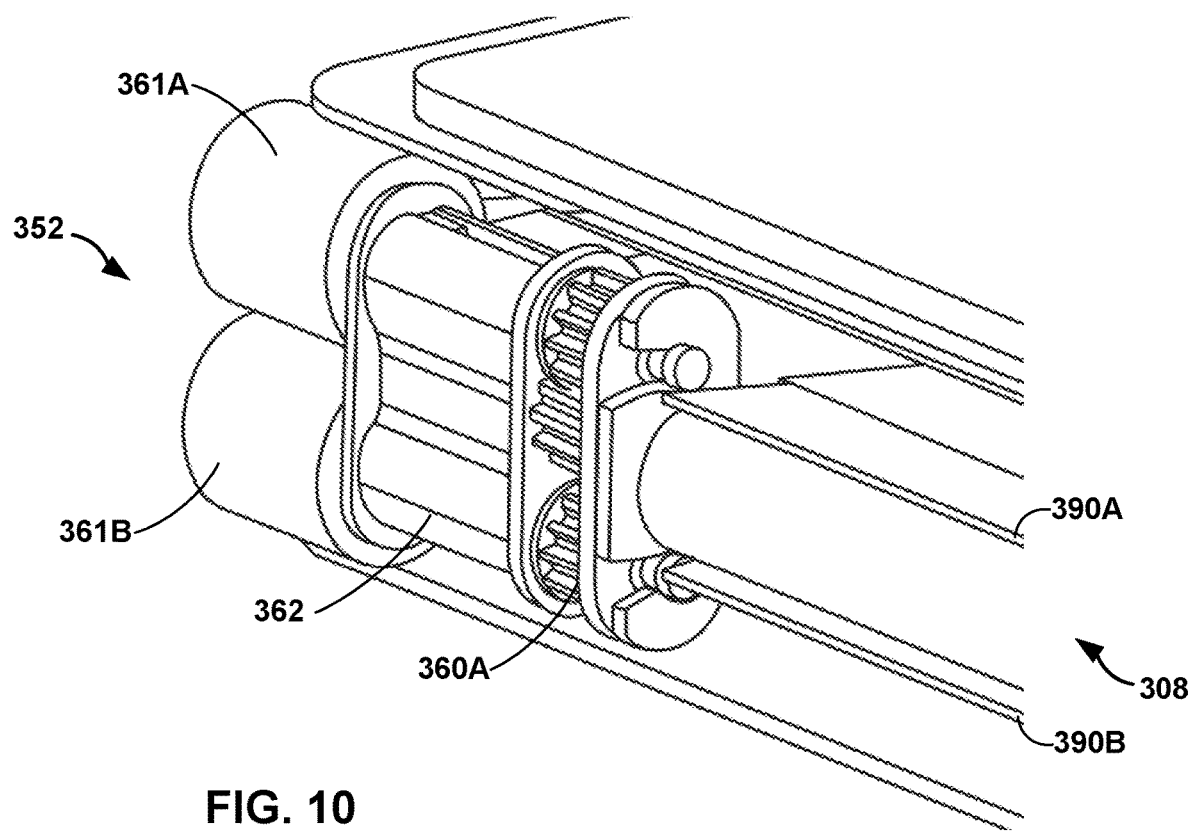
FIG. 10 is a schematic diagram illustrating a hinge of a folding device with a flexible display, in accordance with one or more aspects of this disclosure.

FIG. 10 is a schematic diagram illustrating a hinge of a folding device with a flexible display, in accordance with one or more aspects of this disclosure. As shown in FIG. 10, top hinge region 352 may include a respective pin/rod/shaft on each of first axis 316A and second axis 316B that connects rotating hinge members, friction sleeve 362, and synchronization components 360A.

As discussed above, device 300 may include one or more supporting plates attached to display 306. For example, as shown in FIG. 10, device 300 may include supporting plates 390A and 390B. While illustrated as two discrete plates, as discussed above, the one or more supporting plates may be a single plate with an etched/perforated region that enables folding of the plate with display 306 (e.g., as shown in FIG. 18K).

Figure 11:
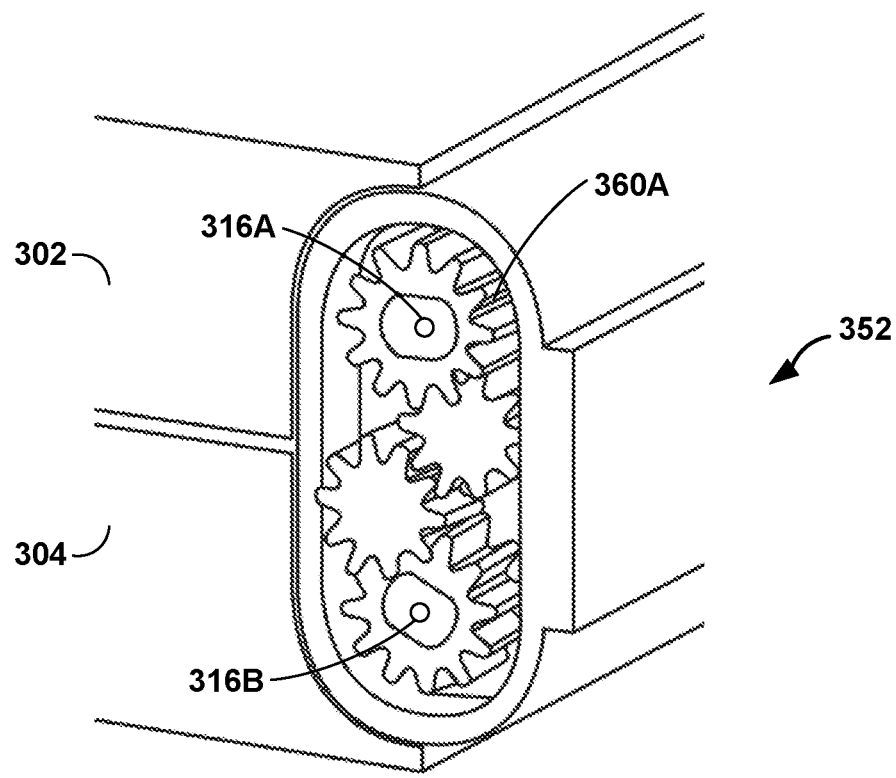
FIG. 11 is a schematic diagram illustrating a hinge of a folding device with a flexible display, in accordance with one or more aspects of this disclosure.

FIG. 11 is a schematic diagram illustrating a hinge of a folding device with a flexible display, in accordance with one or more aspects of this disclosure. In particular, FIG. 11 is a cross section of synchronization components 360A in top hinge region 352. As shown in FIG. 11, synchronization components 360A cause first assembly 302 and second assembly 304 to symmetrically rotate about first axis 316A and second axis 316B.

Figure 12:
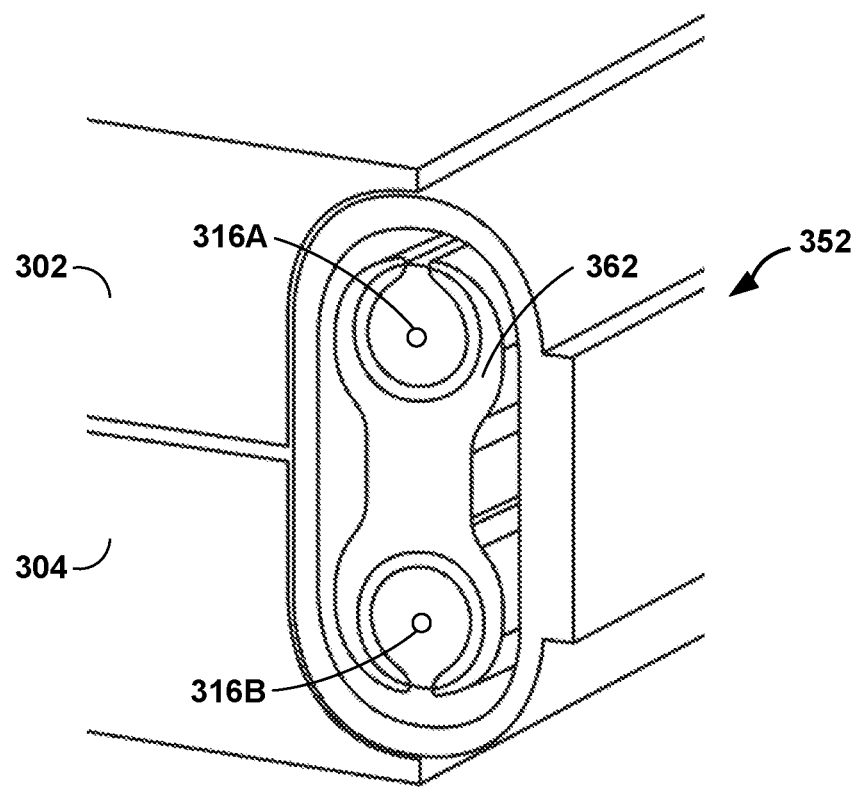
FIG. 12 is a schematic diagram illustrating a hinge of a folding device with a flexible display, in accordance with one or more aspects of this disclosure.

FIG. 12 is a schematic diagram illustrating a hinge of a folding device with a flexible display, in accordance with one or more aspects of this disclosure. In particular, FIG. 12 is a cross section of friction sleeve 362 in top hinge region 352. As shown in FIG. 12, friction sleeve 362 may increase the amount of force needed to cause first assembly 302 to rotate about first axis 316A and increase the amount of force needed to cause second assembly 304 to rotate about second axis 316B.

Figure 13:
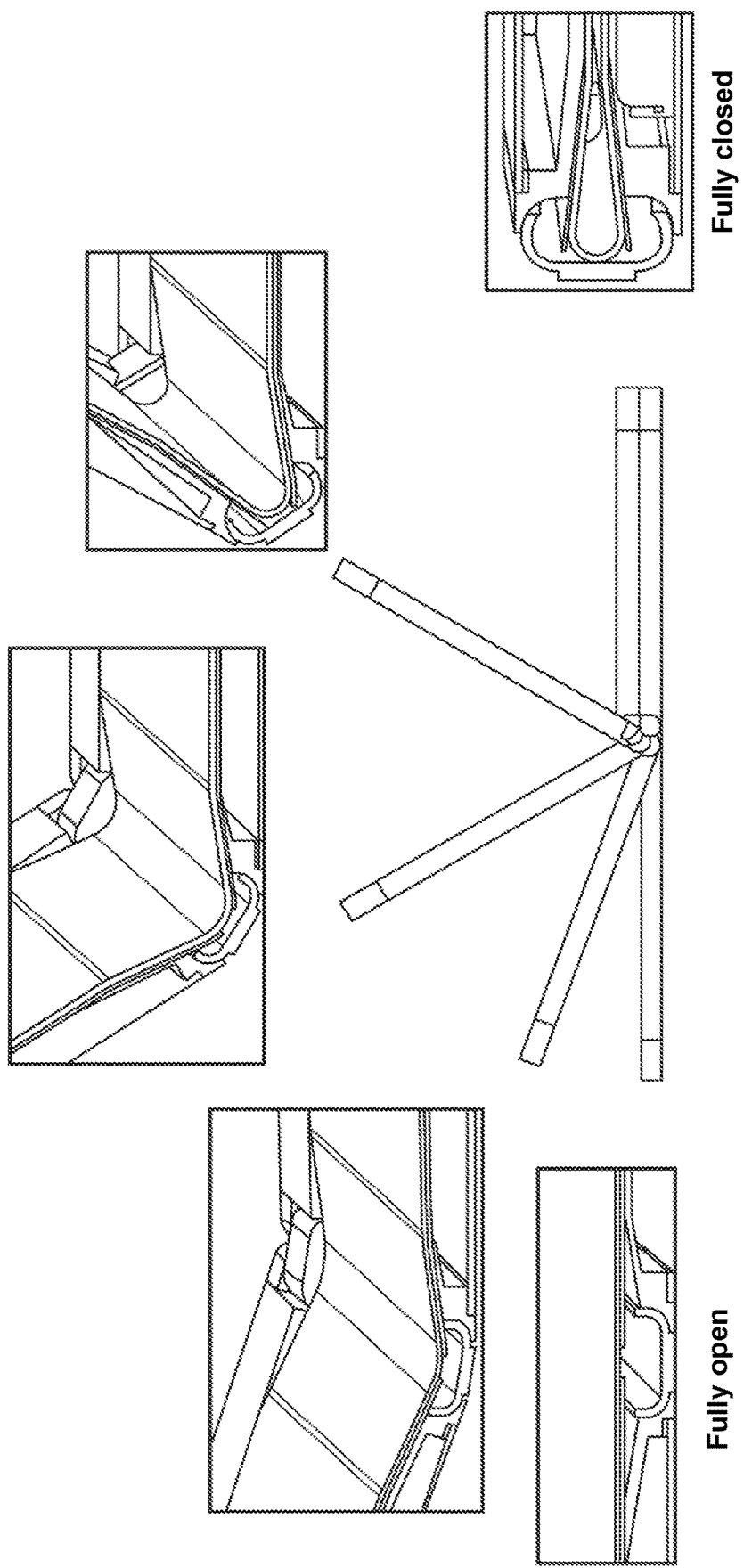
FIG. 13 is a schematic diagram illustrating a folding device with a flexible display in a plurality of folded states, in accordance with one or more aspects of this disclosure.

FIG. 13 is a schematic diagram illustrating a folding device with a flexible display in a plurality of folded states, in accordance with one or more aspects of this disclosure. As can be seen in FIG. 13, at least a portion of primary flexible segment 308 of display 306 resides within hinge assembly 322 while device 300 is closed. As also shown in FIG. 13, when device 300 is fully open, the inner surface of first assembly 302 is coplanar with the inner surface of second assembly 304.

Figure 14:
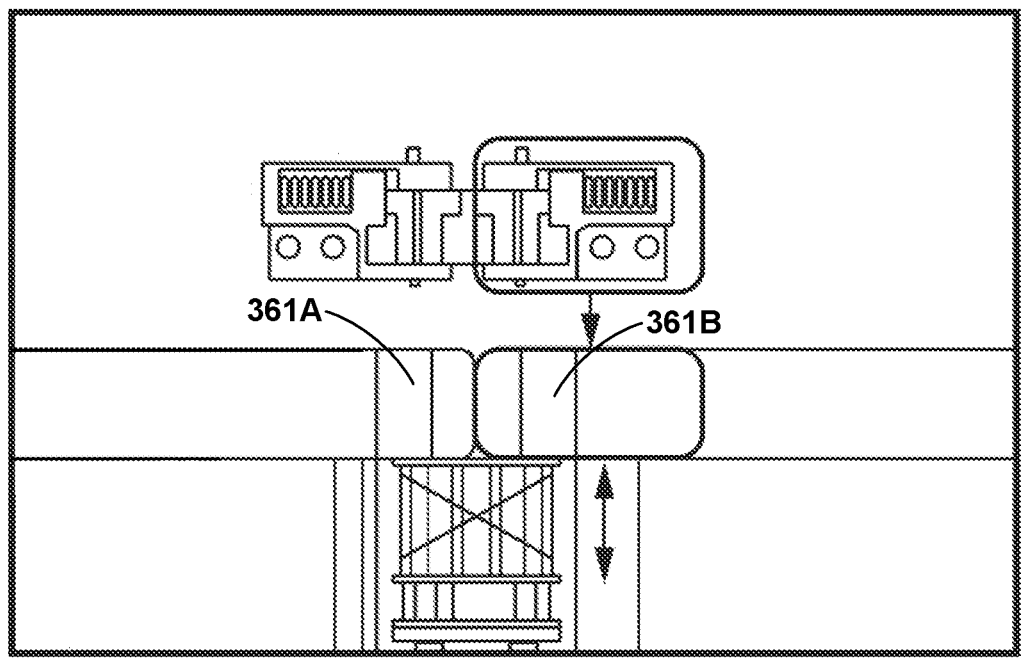
FIG. 14 is a schematic diagram illustrating a folding device with a flexible display with a friction member, in accordance with one or more aspects of this disclosure.

FIG. 14 is a schematic diagram illustrating a folding device with a flexible display with a friction member, in accordance with one or more aspects of this disclosure. As discussed above, in some examples, device 300 may include friction sleeve 362 that increases the amount of force needed to rotate first assembly 302 about first axis 316A and/or increases the amount of force needed to rotate second assembly 304 about second axis 316B. In some examples, as opposed to including friction sleeve 362, device 300 may include other components that increase the amount of force needed to rotate first assembly 302 about first axis 316A and/or increase the amount of force needed to rotate second assembly 304 about second axis 316B. For instance, as shown in FIG. 14, device 300 may include spring-loaded shaft 363A within rotating hinge member 361A that is configured to increase the amount of force needed to rotate first assembly 302 about first axis 316A. Similarly, device 300 may include spring-loaded shaft 363B within rotating hinge member 361B configured to increase the amount of force needed to rotate second assembly 304 about second axis 316B. Each of spring-loaded shafts 363A and 363B may include a spring oriented perpendicularly to the axis of rotation. By including resistive components (e.g., spring-loaded shafts) in the rotating hinge members, a length of hinge assembly (e.g., hinge assembly 322) may be reduced. In this way, a size of top bezel 353 (e.g., a length in the y-dimension) may be reduced.

Figure 15:
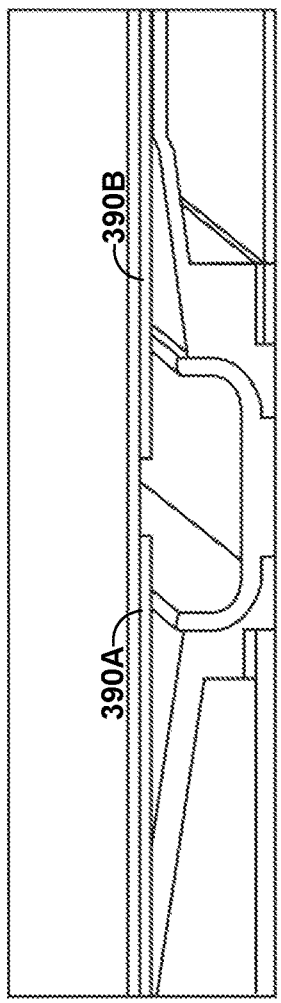
FIG. 15 is a schematic diagram illustrating a folding device with a flexible display having support platforms, in accordance with one or more aspects of this disclosure.

FIG. 15 is a schematic diagram illustrating a folding device with a flexible display having support platforms, in accordance with one or more aspects of this disclosure. As discussed above, it may be desirable for a span of display 306 to be supported (e.g., to reduce waviness). As shown in FIG. 15, support may be provided by supporting plates 390A and 390B, which may be attached to display 306.

Figure 16:
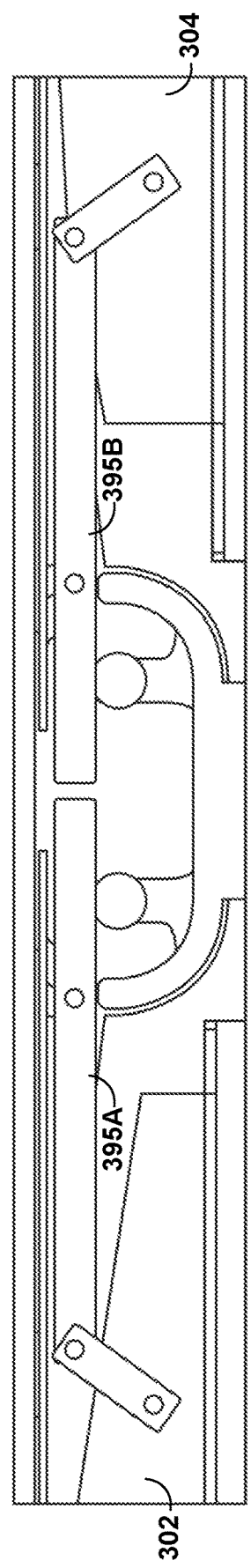
FIG. 16 is a schematic diagram illustrating a folding device with a flexible display having support platforms, in accordance with one or more aspects of this disclosure.

In addition to, or in place of supporting plates 390A and 390B, device 300 may include one or more collapsible support platforms that support display 306 when device 300 is opened. FIG. 16 is a schematic diagram illustrating a folding device with a flexible display having collapsible support platforms, in accordance with one or more aspects of this disclosure. As shown in FIG. 16, device 300 may include first collapsible support platform 395A attached to first assembly 302 and configured to support continuous display 306 when device 300 is fully opened. Similarly, device 300 may include second collapsible support platform 395B attached to second assembly 304 and configured to support display 306 when device 300 is fully opened. When device 300 is closed, collapsible support platforms 395A and 395B may fold down to enable a portion of display 306 to reside within hinge assembly 322.

Figure 17:
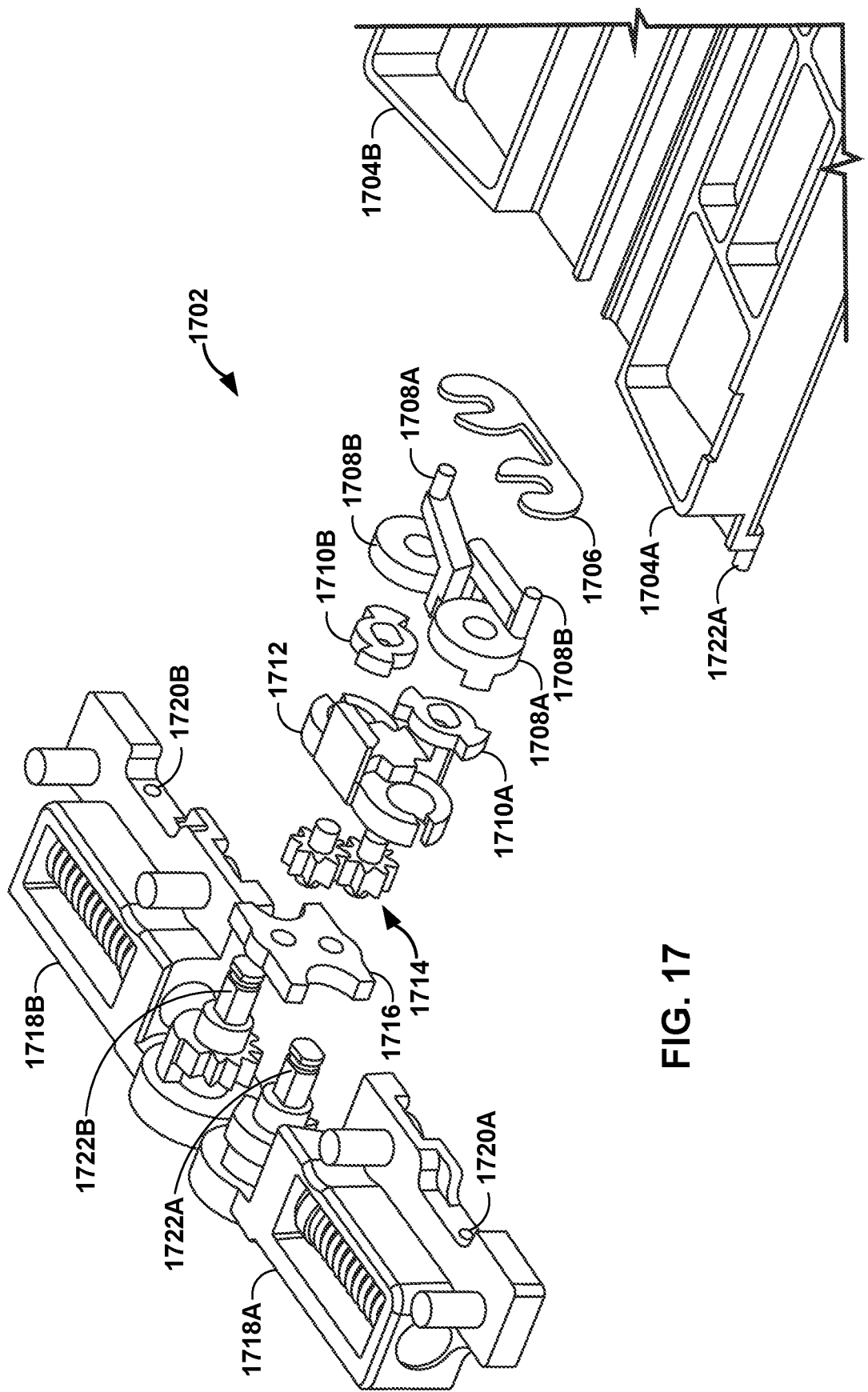
FIG. 17 is a schematic diagram illustrating an exploded view of components of a folding device with a flexible display having support platforms, in accordance with one or more aspects of this disclosure.

FIG. 17 is a schematic diagram illustrating an exploded view of components of a folding device with a flexible display having support platforms, in accordance with one or more aspects of this disclosure. As discussed above, a folding device may include one or more collapsible support platforms that support a display of the folding device 300. For instance, as discussed above with reference to FIGS. 15 and 16, device 300 may include collapsible support platforms 395A and 395B that support display 306 (e.g., at least when device 300 is fully opened).

Collapsible support platforms 1704A and 1704B (collectively, "collapsible support platforms 1704") of FIG. 17 may be considered to be examples collapsible support platforms 395A and 395B. For instance, collapsible support platform 1704A may be included in first assembly 302 and may support a portion of continuous display 306 (e.g., secondary rigid segment 324 and/or at least a portion of primary flexible segment 308) when device 300 is fully opened. Similarly, collapsible support platform 1704B may be included in second assembly 304 and may support a portion of continuous display 306 (e.g., secondary rigid segment 326 and/or at least a portion of primary flexible segment 308) when device 300 is fully opened.

A folding device, such as device 300, may include components 1702 that are configured to actuate collapsible support platforms 1704. For instance, as device 300 is moved to from the fully closed state to the fully opened state, components 1702 may cause collapsible support platforms 1704 to deploy. Similarly, as device 300 is moved to from the fully opened state to the fully closed state, components 1702 may cause collapsible support platforms 1704 to retract. In this way, when device 300 is closed, components 1702 enable collapsible support platforms 1704 to move out of the way such that a portion of display 306 may reside within a hinge assembly, such as hinge assembly 322.

As shown in the example of FIG. 17, components 1702 may include shaft clip 1706, lever arms 1708A and 1708B (collectively, "lever arms 1708"), lever knobs 1710A and 1710B (collectively, "lever knobs 1710"), clamp stop 1712, auxiliary gears 1714, cap bracket 1716, and moving arm assemblies 1718A and 1718B (collectively, "moving arm assemblies 1718). As shown in FIG. 17, moving arm assemblies 1718 may each include a pin on which other components may be mounted. For instance, moving arm assembly 1718A may include pin 1722A on which at least lever knob 1710A and lever arm 1708A may be mounted, and moving arm assembly 1718B may include pin 1722B on which at least lever knob 1710B and lever arm 1708B may be mounted. Pin 1722A may be centered about a first axis, such as first axis 316A. Pin 1722B may be centered about a second axis, such as second axis 316B.

As discussed below and shown in FIGS. 22-30, as device 300 is moved between opened and closed positions, lever knobs 1710 may remain fixed on their respective axes. For instance, as shown in FIG. 17, an outer geometry of pin 1722A and an inner geometry of lever knob 1710A may prevent lever knob 1710A from rotating about pin 1722A. Similarly, an outer geometry of pin 1722B and an inner geometry of lever knob 1710B may prevent lever knob 1710B from rotating about pin 1722B. As pins 1722 are respectively attached to the first assembly and the second assembly (e.g., via moving arm assemblies 1718), such an arrangement may result in lever knobs 1710 respectively rotating in sync with the first assembly and the second assembly.

At a certain point in the transition from closed to open (e.g., 155 degrees), appendages of lever knobs 1710 may cause lever arms 1708 to rotate. Rotation of lever arms 1708 may cause deployment of collapsible support platforms 1704. For instance, rotation of lever arm 1708A may push collapsible support platform 1704B up towards a rear surface of display 306. Similarly, rotation of lever arm 1708B may push collapsible support platform 1704A up towards the rear surface of display 306.

As such, lever knob 1710A may be a first lever knob fixed on a first axis (e.g., first axis 316A), the first lever knob including an appendage configured to engage with and rotate a first lever arm (e.g., lever arm 1708A) at a particular point in transition of the folding device from fully closed to fully open. Similarly, lever knob 1710B may be a second lever knob fixed on a second axis (e.g., second axis 316B), the second lever knob including an appendage configured to engage with and rotate a second lever arm (e.g., lever arm 1708B) at a particular point in transition of the folding device from fully closed to fully open. Furthermore, lever arm 1708A may be a first lever arm that pushes, at the particular point in transition of the folding device from fully closed to fully opened, a second collapsible support platform (e.g., collapsible support platform 1704B) toward a rear surface of the continuous display (e.g., display 308). Additionally, lever arm 1708B may be a second lever arm that pushes, at the particular point in transition of the folding device from fully closed to fully opened, a first collapsible support platform (e.g., collapsible support platform 1704A) toward a rear surface of the continuous display (e.g., display 308).

As shown in FIG. 17, each of collapsible support platforms 1704 may each include a pin that is configured to mate with a hole in a moving arm assembly of moving arm assemblies 1718. For instance, collapsible support platform 1704A may include pin 1722A configured to mate with hole 1720A of moving arm assembly 1718A. Similarly, collapsible support platform 1704B may include pin 1722B configured to mate with hole 1720B of moving arm assembly 1718B. While only one end of collapsible support platforms 1704 is shown in FIG. 17, it is understood that the other ends of collapsible support platforms 1704 may include pins similar to pins 1704.

When pushed by lever arms 1708, collapsible support platforms 1704 may be configured to rotate about pins 1722. For instance, to push collapsible support platform 1704A toward the rear surface of the display, lever arm 1708B may cause collapsible support platform 1704A to rotate about pin 1722A. Similarly, to push collapsible support platform 1704B toward the rear surface of the display, lever arm 1708A may cause collapsible support platform 1704B to rotate about pin 1722B.

Figure 18A:
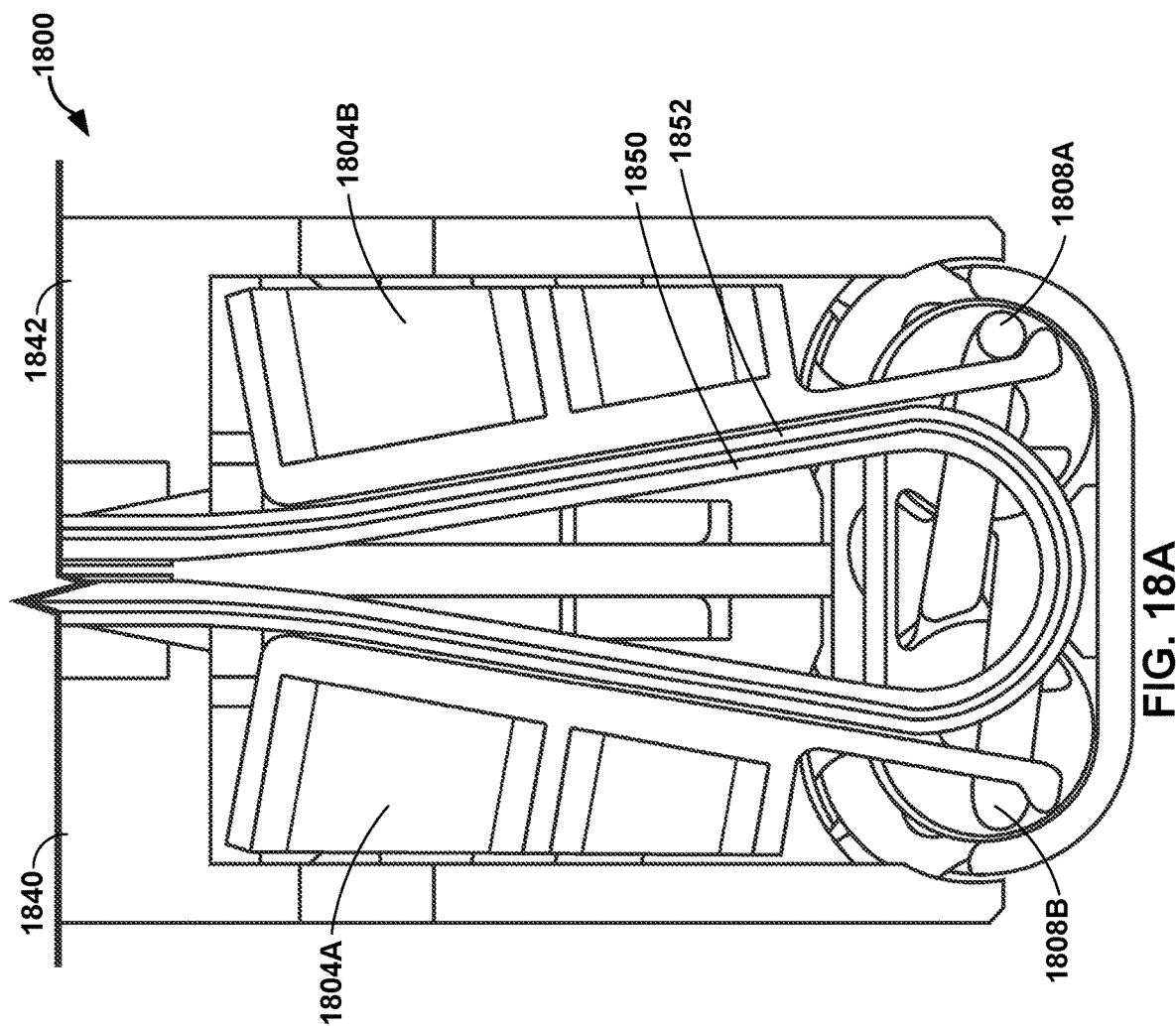
Figure 18C:
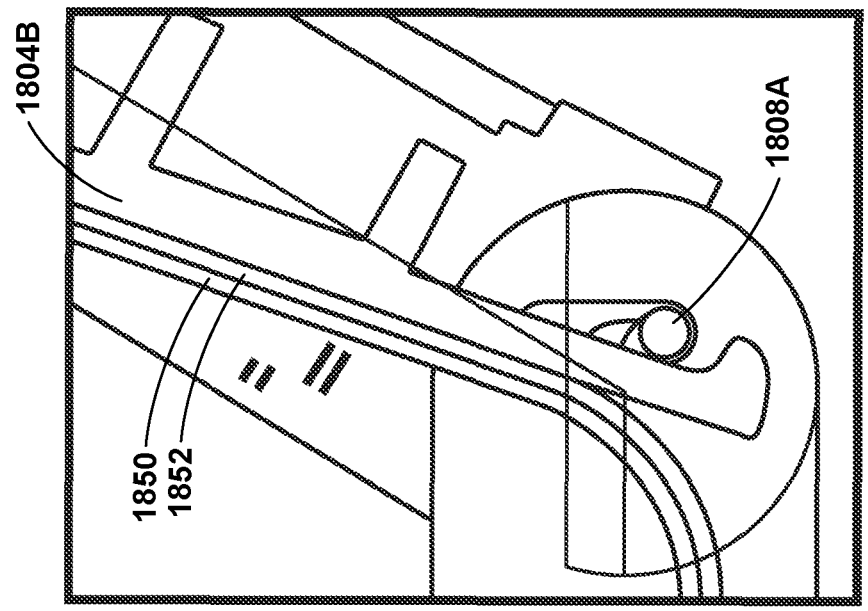
Figure 18B:
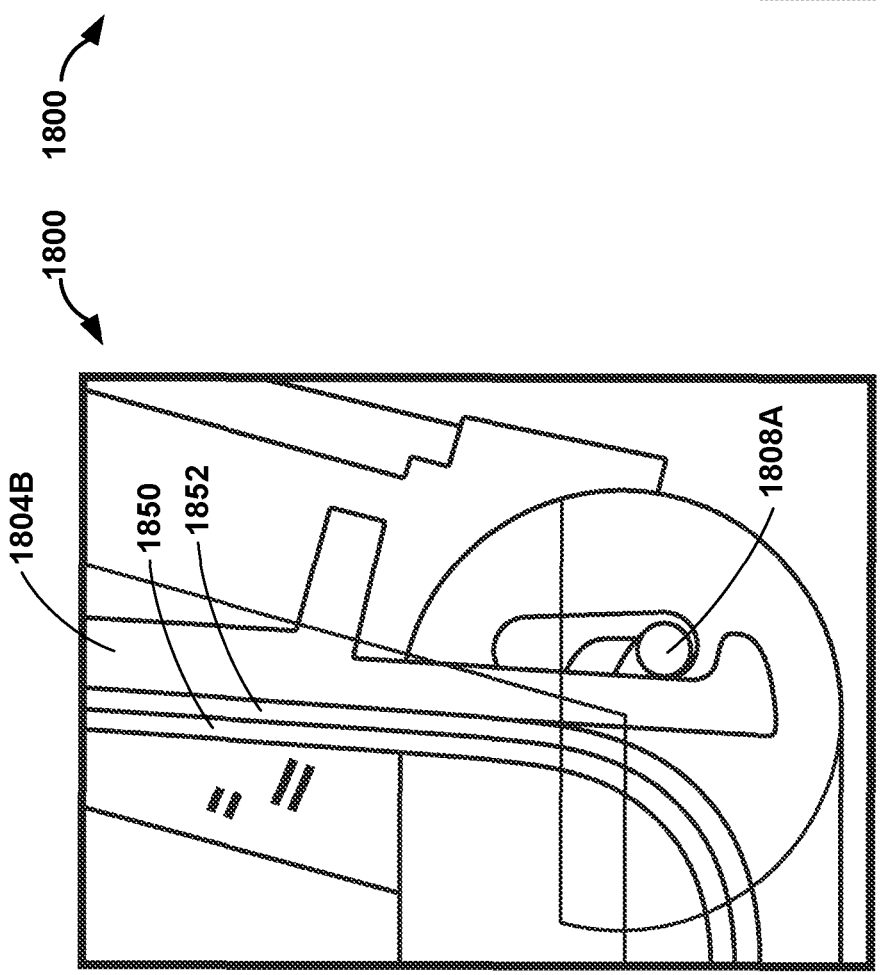
Figure 18E:
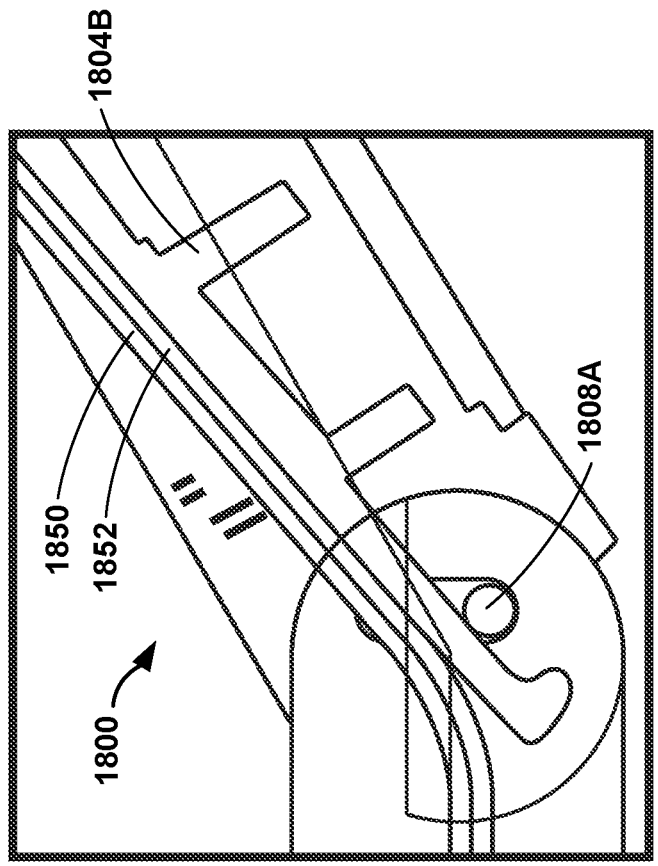
Figure 18D:
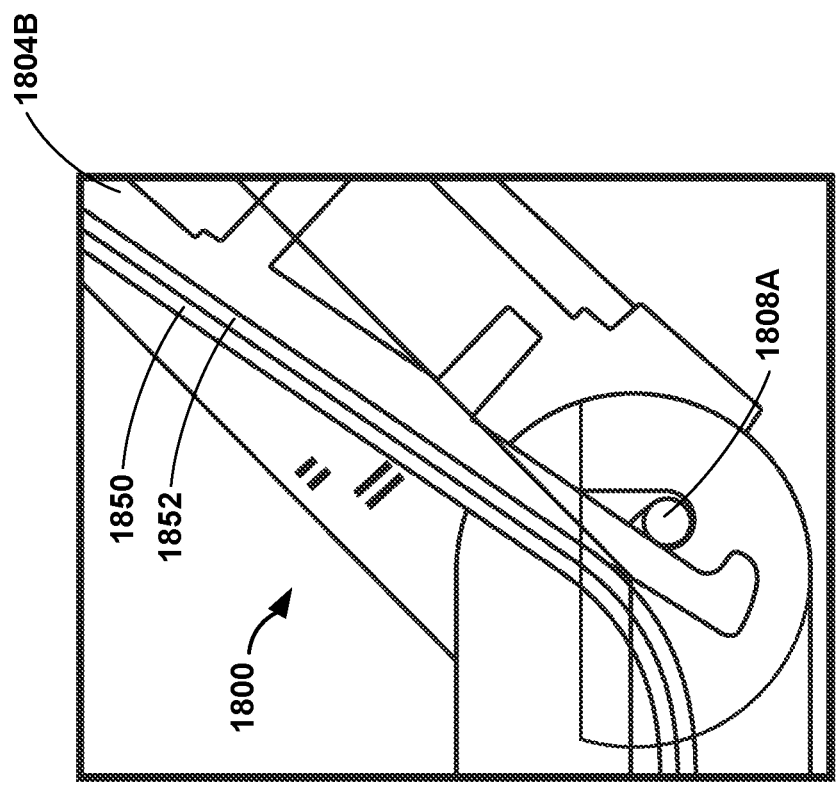
Figure 18G:
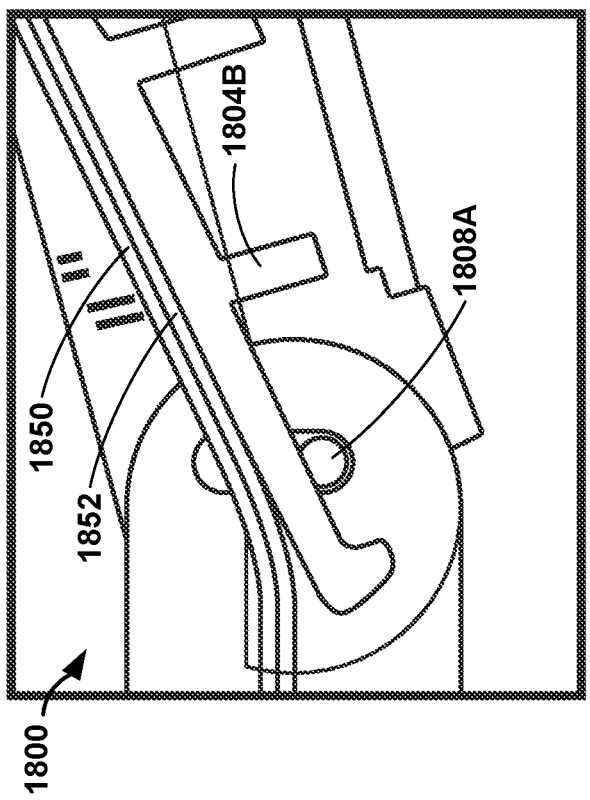
Figure 18F:
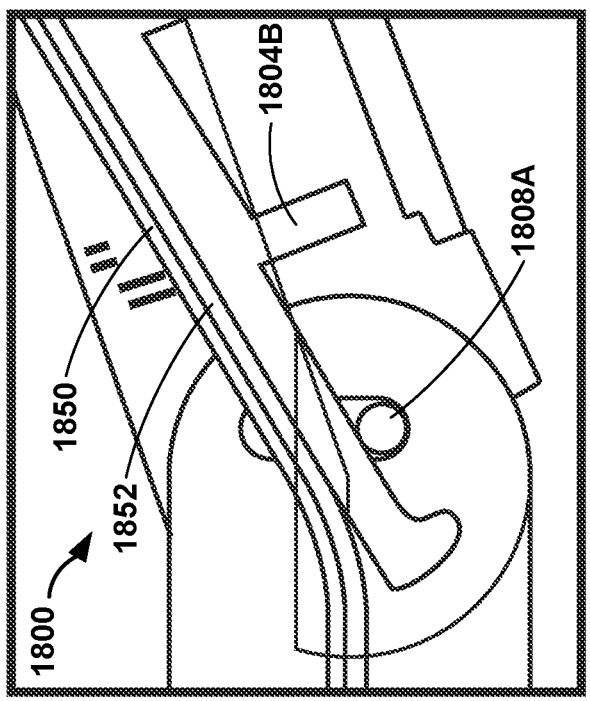
Figure 18I:
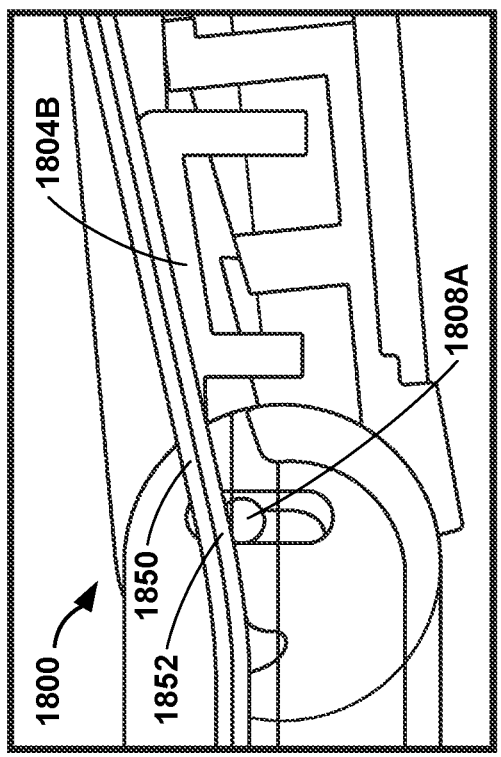
Figure 18H:
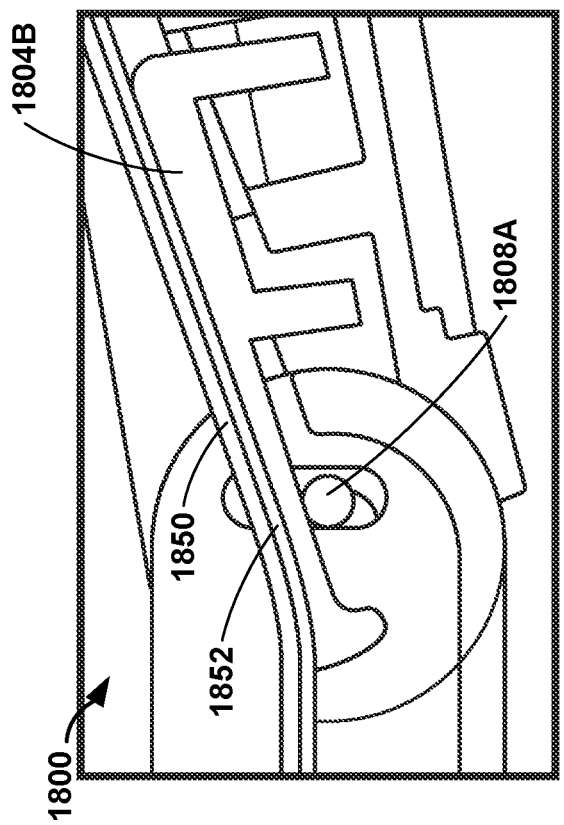
Figure 18K:
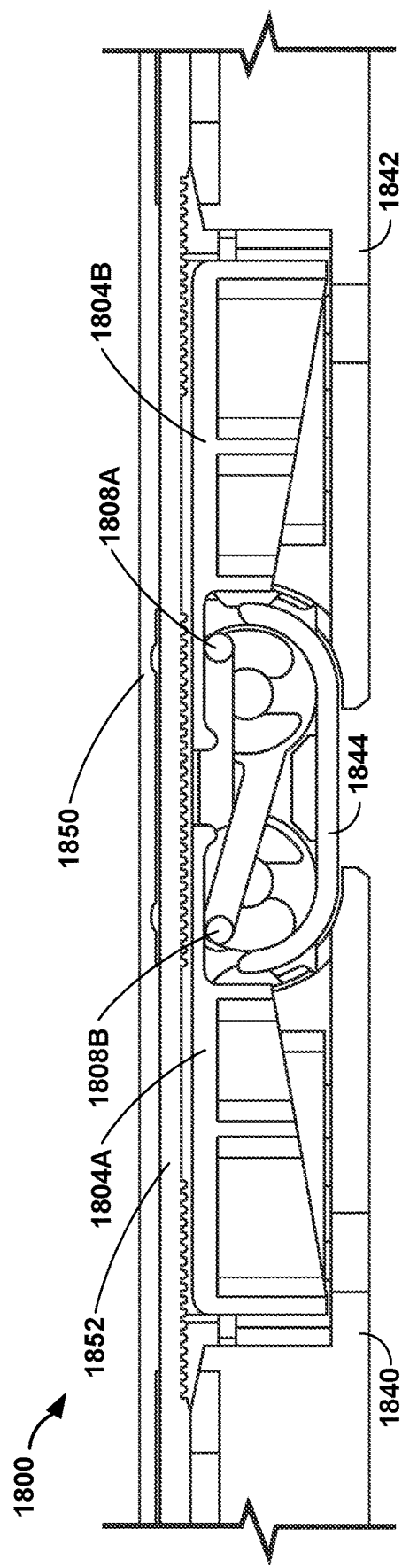

FIGS. 18A-18K are schematic diagrams illustrating cross sections of a folding device with a flexible display having support platforms in a variety of positions, in accordance with one or more aspects of this disclosure. Folding device 1800 may be an example of device 300 as discussed above. FIG. 18A illustrates folding device 1800 in the fully closed position, FIGS. 18B-18J illustrate the folding device in a plurality of intermediate positions, and FIG. 18K illustrates the folding device in the fully closed position. Collapsible support platforms 1804A and 1804B, and lever arms 1808A and 1808B may to be examples of collapsible support platforms 1704 and lever arms 1708. Similarly, display 1850, first assembly 1840, second assembly 1842, hinge assembly 1844, and supporting plate 1852 may to be examples of display 306, first assembly 302, second assembly 304, hinge assembly 322, and supporting plates 390.

As can be seen through FIGS. 18A-18K, as device 1800 is moved from the fully closed position (FIG. 18A) to the fully open position (FIG. 18K), lever arms 1808 may push collapsible support platforms 1804 up against a bottom surface of supporting plate 1852. The support thusly provided by collapsible support platforms 1804 may provide added resistance against deflection of display 1850. Due to collapsible support platforms 1804, a user moving their finger across a primary flexible segment of display 1850 may not deflect display 1850 downwards (e.g., and the user may not feel a noticeable bump).

In some examples, collapsible support platforms 1804 may be supported at both ends when deployed. For instance, as shown in FIG. 18K, distal points of collapsible support platforms 1804 (e.g., farthest away from hinge assembly 1844) may be respectively supported by an inner surface of first assembly 1840 and second assembly 1842. Similarly, proximal points of collapsible support platforms 1804 (e.g., closest to hinge assembly 1844) may be respectively supported by lever arms 1808A and 1808B.

In some examples, collapsible support platforms 1904A and 1904B may be adhered to the bottom surface of supporting plate 1852. For instance, an adhesive (e.g., glue) may be used to attach collapsible support platforms 1904A and 1904B to the bottom surface of supporting plate 1852.

Figure 19A:
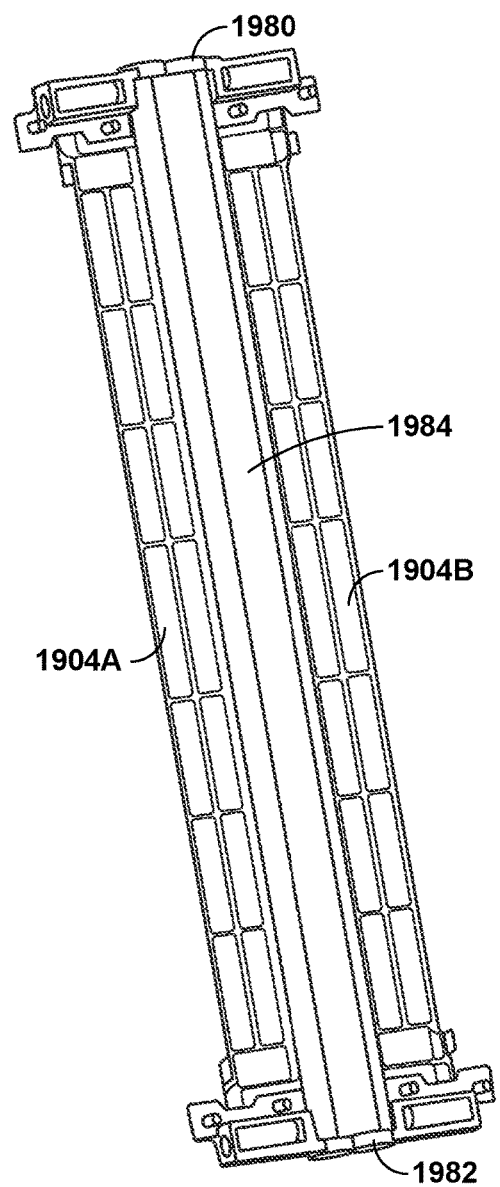
FIGS. 19A and 19B are schematic diagrams illustrating front and back view of a hinge mechanism and support platforms of a folding device with a flexible display, in accordance with one or more aspects of this disclosure.
Figure 19B:
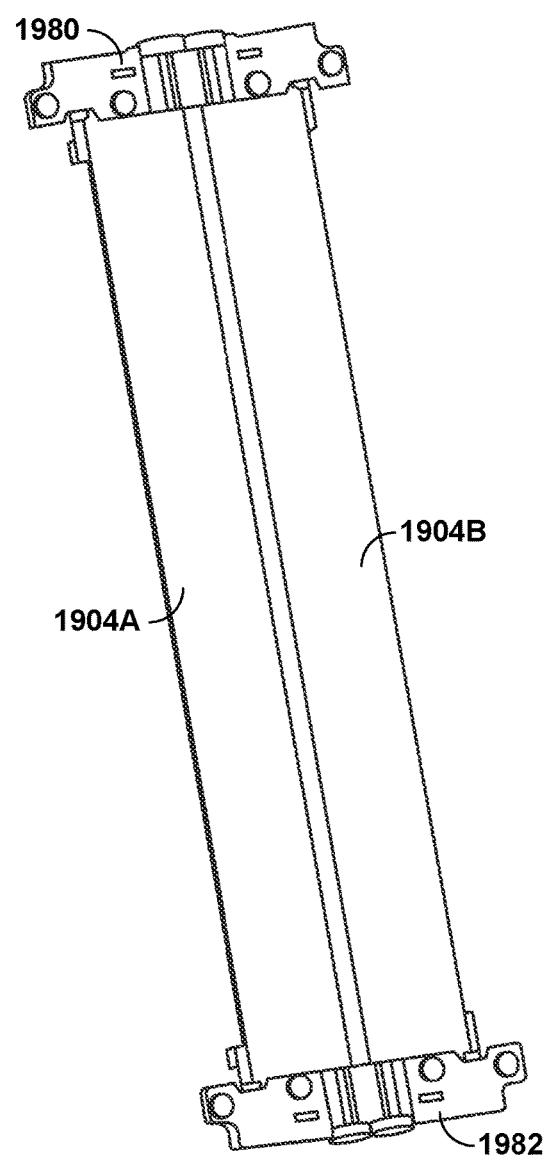

FIGS. 19A and 19B are schematic diagrams illustrating front and back view of a hinge mechanism and support platforms of a folding device with a flexible display, in accordance with one or more aspects of this disclosure. Top hinge region 1980, bottom hinge region 1982, center hinge region 1984, collapsible support platforms 1904A and 1904B may be examples of top hinge region 352, bottom hinge region 356, center hinge region 354, collapsible support platforms 1804A and 1804B. As can be seen in FIG. 19A, bottoms of collapsible support platforms 1904A and 1904B may be hollow (e.g., to reduce weight). As can be seen in FIG. 19B, tops of collapsible support platforms 1904A and 1904B may be flat (e.g., to smoothly engage a bottom of supporting plate 1852).

FIGS. 20A and 20B are schematic diagrams illustrating cross sections of a folding device with a flexible display in open and closed positions, in accordance with one or more aspects of this disclosure. Device 2000 may be an example of device 1800. first assembly 2040, second assembly 2042, and hinge assembly 2044 may be examples of first assembly 1840, second assembly 1842, and hinge assembly 1844.

In some examples, an outer surface of hinge assembly 2044 may be flat. For instance, as shown in FIG. 4, outer surface 323 of hinge assembly 322 may be flat. In some examples, outer surface 2046 of hinge assembly 2044 may be curved (e.g., as shown in FIGS. 20A and 20B). Where outer surface 2046 of hinge assembly 2044 is curved, portions of first assembly 2040 and second assembly 2042 may be tapered so as to form a smooth structure where device 2000 is closed as shown in FIG. 20A

The following numbered example may illustrate one or more aspects of this disclosure:

Various aspects have been described in this disclosure. These and other aspects are within the scope of the following claims.

The invention claimed is:

1. A folding device comprising:
   a first assembly having an inner and an outer surface;
   a second assembly having an inner and an outer surface;
   a hinge assembly connected to the first assembly and the second assembly;
   a continuous display including:
      a first rigid segment attached to and coplanar with the inner surface of the first assembly,
      a second rigid segment attached to and coplanar with the inner surface of the second assembly,
      a primary flexible segment; and
      a third rigid segment disposed between the second rigid segment and the primary flexible segment, wherein the third rigid segment is articulable relative to the second rigid segment;
   a first collapsible support platform attached to the first assembly and configured to support the continuous display when the folding device is fully opened, wherein the first collapsible support platform is not attached to the continuous display, and wherein, when the folding device is fully closed, at least a portion of the first collapsible support platform proximate to the hinge assembly does not support the continuous display; and
   a second collapsible support platform attached to the second assembly and configured to support the continuous display when the folding device is fully opened, wherein the second collapsible support platform is not attached to the continuous display, and wherein, when the folding device is fully closed, at least a portion of the second collapsible support platform proximate to the hinge assembly does not support the continuous display,
   wherein the first assembly is rotatably connected to the hinge assembly about a first axis, the second assembly is rotatably connected to the hinge assembly about a second axis, and
   wherein when the folding device is fully opened about the hinge, the inner surface of the first assembly is coplanar with the inner surface of the second assembly, and when the folding device is fully closed, an apex of the primary flexible segment is closer to an outer surface of the hinge assembly than a plane that is parallel to the first axis and a second axis.

2. The folding device of claim 1, wherein the continuous display further comprises a fourth rigid segment disposed between the first rigid segment and the primary flexible segment, wherein the fourth rigid segment is articulable relative to the first rigid segment.

3. The folding device of claim 2, wherein a width of the third rigid segment is less than 25% of a width of the second rigid segment, and wherein a width of the fourth rigid segment is less than 25% of a width of the first rigid segment.

4. The folding device of claim 2, wherein the third rigid segment is configured to articulate at most 45 degrees with respect to the second rigid segment, and wherein the fourth rigid segment is configured to articulate at most 45 degrees with respect to the first rigid segment.

5. The folding device of claim 1, wherein the primary flexible segment is configured to fold at least 180 degrees.

6. The folding device of claim 1, further comprising one or more supporting plates attached to the continuous display.

7. The folding device of claim 6, wherein the one or more supporting plates includes a single supporting plate attached to the primary flexible segment, the first rigid segment, the second rigid segment, and the third rigid segment, wherein the single supporting plate is configured to permit bending between the segments.

8. The folding device of claim 7, wherein, to permit bending between segments, the single supporting plate is etched and/or perforated at a boundary between adjacent segments.

9. The folding device of claim 1, further comprising:
   a first lever arm that pushes, at a particular point in transition of the folding device from fully closed to fully opened, the second collapsible support platform toward a rear surface of the continuous display; and
   a second lever arm that pushes, at the particular point in transition of the folding device from fully closed to fully opened, the first collapsible support platform toward a rear surface of the continuous display.

10. The folding device of claim 9, further comprising:
   a hinge assembly, wherein:
      the first assembly is rotatably connected to the hinge assembly about a first axis,
      the first lever arm is configured to rotate about the first axis,
      the second assembly is rotatably connected to the hinge assembly about a second axis, and
      the second lever arm is configured to rotate about the second axis;
   a first lever knob fixed on the first axis, the first lever knob including an appendage configured to engage with and rotate the first lever arm at the particular point in transition of the folding device from fully closed to fully open; and
   a second lever knob fixed on the second axis, the second lever knob including an appendage configured to engage with and rotate the second lever arm at the particular point in transition of the folding device from fully closed to fully open.

11. The folding device of claim 1, further comprising:
a hinge assembly, wherein:
the first assembly is rotatably connected to the hinge assembly about a first axis,
a first lever arm is configured to rotate about the first axis,
the second assembly is rotatably connected to the hinge assembly about a second axis, and
a second lever arm is configured to rotate about the second axis;
a first lever knob fixed on the first axis, the first lever knob including an appendage configured to engage with and rotate the first lever arm at a particular point in transition of the folding device from fully closed to fully open; and
a second lever knob fixed on the second axis, the second lever knob including an appendage configured to engage with and rotate the second lever arm at the particular point in transition of the folding device from fully closed to fully open.

12. The folding device of claim 1, wherein the hinge assembly comprises an outer surface and an inner surface, wherein the hinge assembly comprises a top hinge region, a center hinge region, and a bottom hinge region, wherein, when the folding device is fully closed, at least a portion of the primary flexible segment resides within the center hinge region, and wherein the first assembly and second assembly are each rotatably connected to the top hinge region and the bottom hinge region.

13. The folding device of claim 12, wherein the hinge assembly further comprises one or more synchronization components configured to match rotation of the first assembly about the first axis with rotation of the second assembly about the second axis.

14. The folding device of claim 13, wherein the one or more synchronization components comprise a first gear connected to the first assembly and rotating about the first axis, a second gear connected to the second assembly and rotating about the second axis, two or more intermediate gears connecting the first gear to the second gear.

15. The folding device of claim 13, wherein the one or more synchronization components are not located under the continuous display.

16. The folding device of claim 13, wherein the one or more synchronization components are located under a top bezel and/or a bottom bezel of the first assembly and the second assembly that borders the continuous display.

17. The folding device of claim 13, wherein the one or more synchronization components are located either in the top hinge region or in the bottom hinge region.

18. The folding device of claim 13, wherein a first set of the one or more synchronization components are located in the top hinge region, and a second set of the one or more synchronization components are located in the bottom hinge region.

19. The folding device of claim 12, wherein, when the folding device is fully opened, an inner surface of the center hinge region supports the continuous display.

20. A folding device comprising: a first assembly having an inner and an outer surface; a second assembly having an inner and an outer surface; a hinge assembly connected to the first assembly and the second assembly; a continuous display including: a first rigid segment attached to the first assembly, a second rigid segment attached to the second assembly, a flexible segment disposed between the first rigid segment and the second rigid segment; and a first collapsible support platform attached to the first assembly and configured to support the continuous display when the folding device is fully opened, wherein the first collapsible support platform is not attached to the continuous display, and wherein, when the folding device is fully closed, at least a portion of the first collapsible support platform proximate to the hinge assembly does not support the continuous display; and a second collapsible support platform attached to the second assembly and configured to support the continuous display when the folding device is fully opened, wherein the second collapsible support platform is not attached to the continuous display, and wherein, when the folding device is fully closed, at least a portion of the second collapsible support platform proximate to the hinge assembly does not support the continuous display, wherein the first assembly is rotatably connected to the hinge assembly about a first axis, the second assembly is rotatably connected to the hinge assembly about a second axis, and wherein when the folding device is fully opened about the hinge, the inner surface of the first assembly is coplanar with the inner surface of the second assembly, and when the folding device is fully closed, an apex of the primary flexible segment is closer to an outer surface of the hinge assembly than a plane.

21. The folding device of claim 20, further comprising a supporting plate attached to the primary flexible segment, the first rigid segment, and the second rigid segment, wherein the supporting plate is configured to permit bending between the segments, and wherein, to support the continuous display, the first and second collapsible support platforms support the continuous display by supporting the supporting plate.

22. The folding device of claim 21, wherein, to permit bending between segments, the supporting plate is etched and/or perforated at a boundary between adjacent segments.

* * * * *